United States Patent
Masuoka et al.

(10) Patent No.: US 9,461,165 B2
(45) Date of Patent: Oct. 4, 2016

(54) SEMICONDUCTOR DEVICE WITH AN SGT AND METHOD FOR MANUFACTURING THE SAME

(71) Applicant: UNISANTIS ELECTRONICS SINGAPORE PTE. LTD., Singapore (SG)

(72) Inventors: Fujio Masuoka, Tokyo (JP); Nozomu Harada, Tokyo (JP); Hiroki Nakamura, Tokyo (JP)

(73) Assignee: Unisantis Electronics Singapore Pte. Ltd., Singapore (SG)

(*) Notice: Subject to any disclaimer, the term of this patent is extended or adjusted under 35 U.S.C. 154(b) by 0 days.

(21) Appl. No.: 15/068,880

(22) Filed: Mar. 14, 2016

(65) Prior Publication Data

US 2016/0197181 A1    Jul. 7, 2016

Related U.S. Application Data

(63) Continuation of application No. 14/735,275, filed on Jun. 10, 2015, now Pat. No. 9,318,605, which is a continuation of application No. PCT/JP2013/066320, filed on Jun. 13, 2013.

(51) Int. Cl.
  *H01L 29/66* (2006.01)
  *H01L 29/78* (2006.01)
  (Continued)

(52) U.S. Cl.
  CPC ..... *H01L 29/7827* (2013.01); *H01L 21/31116* (2013.01); *H01L 29/0847* (2013.01);
  (Continued)

(58) Field of Classification Search
  CPC .............. H01L 29/7827; H01L 29/42356; H01L 29/41741; H01L 21/28008; H01L 29/66666; H01L 29/1037; H01L 21/823885; H01L 27/092
  See application file for complete search history.

(56) References Cited

U.S. PATENT DOCUMENTS

| 5,258,635 A | 11/1993 | Nitayama et al. |
| 7,061,038 B2 | 6/2006 | Endoh et al. |

(Continued)

FOREIGN PATENT DOCUMENTS

| JP | 01232755 A | 9/1989 |
| JP | 2-188966 A | 7/1990 |

(Continued)

OTHER PUBLICATIONS

Takato, H., et al., "impact of Surrounding Gate Transistor (SGT) for Ultra-High-Density LSI's", IEEE Transactions on Electron Devices, 1991, pp. 573-578, vol. 38, No. 3.

(Continued)

*Primary Examiner* — Victor A Mandala
(74) *Attorney, Agent, or Firm* — Laurence Greenberg; Werner Stemer; Ralph Locher

(57) ABSTRACT

A semiconductor device includes a $P^+$ region and an $N^+$ region functioning as sources of SGTs and disposed in top portions of Si pillars formed on an i-layer substrate. Connections between a power supply wiring metal layer and the $P^+$ region and between a ground wiring metal layer and the $N^+$ region are established on the entire surfaces of low-resistance Ni silicide layers that are respectively in contact with the $P^+$ region and the $N^+$ region and formed on outer peripheries of the Si pillars. Lower ends of the power supply wiring metal layer and the ground wiring metal layer are located at a height of surfaces of HfO layers near the boundaries between the $P^+$ region and a channel and between the $N^+$ region and a channel, respectively.

16 Claims, 36 Drawing Sheets

(51) Int. Cl.
*H01L 29/08* (2006.01)
*H01L 29/417* (2006.01)
*H01L 29/423* (2006.01)
*H01L 21/311* (2006.01)
*H01L 29/45* (2006.01)

(52) U.S. Cl.
CPC ... *H01L29/41741* (2013.01); *H01L 29/42356* (2013.01); *H01L 29/42364* (2013.01); *H01L 29/45* (2013.01); *H01L 29/66666* (2013.01)

(56) References Cited

U.S. PATENT DOCUMENTS

| | | |
|---|---|---|
| 8,901,640 B2 | 12/2014 | Masuoka et al. |
| 2007/0063277 A1 | 3/2007 | Belyansky et al. |
| 2010/0187601 A1 | 7/2010 | Masuoka et al. |
| 2010/0264484 A1 | 10/2010 | Masuoka et al. |
| 2011/0303973 A1 | 12/2011 | Masuoka et al. |
| 2015/0287821 A1* | 10/2015 | Masuoka .......... H01L 21/82388 257/329 |

FOREIGN PATENT DOCUMENTS

| | | |
|---|---|---|
| JP | 2004-186601 A | 7/2004 |
| JP | 2007123415 A | 5/2007 |
| JP | 2009-509359 A | 3/2009 |
| JP | 2010-232631 A | 10/2010 |
| JP | 2011-040421 A | 2/2011 |
| JP | 2011-108702 A | 6/2011 |
| JP | 2011-243908 A | 12/2011 |
| JP | 2012-004244 A | 1/2012 |
| WO | 2009075031 A1 | 6/2009 |

OTHER PUBLICATIONS

Sekine, M., "Background and Challenges for Plasma Etching Tool Development", J. Plasma Fusion Res., 2007, pp. 319-324, vol. 83, No. 4.

Na, H., et al., "A New Compact SRAM Cell by Vertical MOSFET for Low-power and Stable Operation", Memory Workshop, 2011, pp. 1-4, 3rd IEEE International Digest.

* cited by examiner

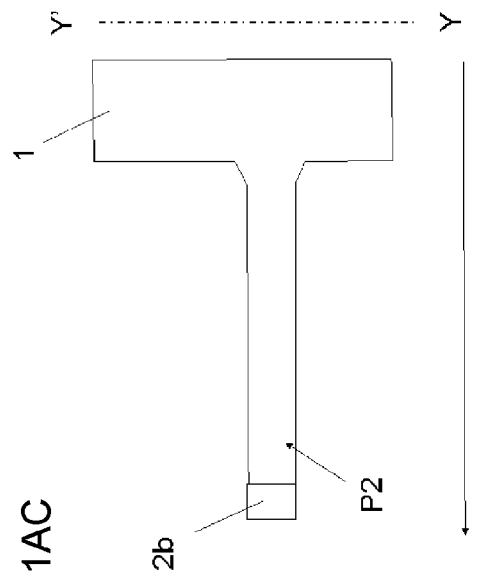
FIG. 1AC
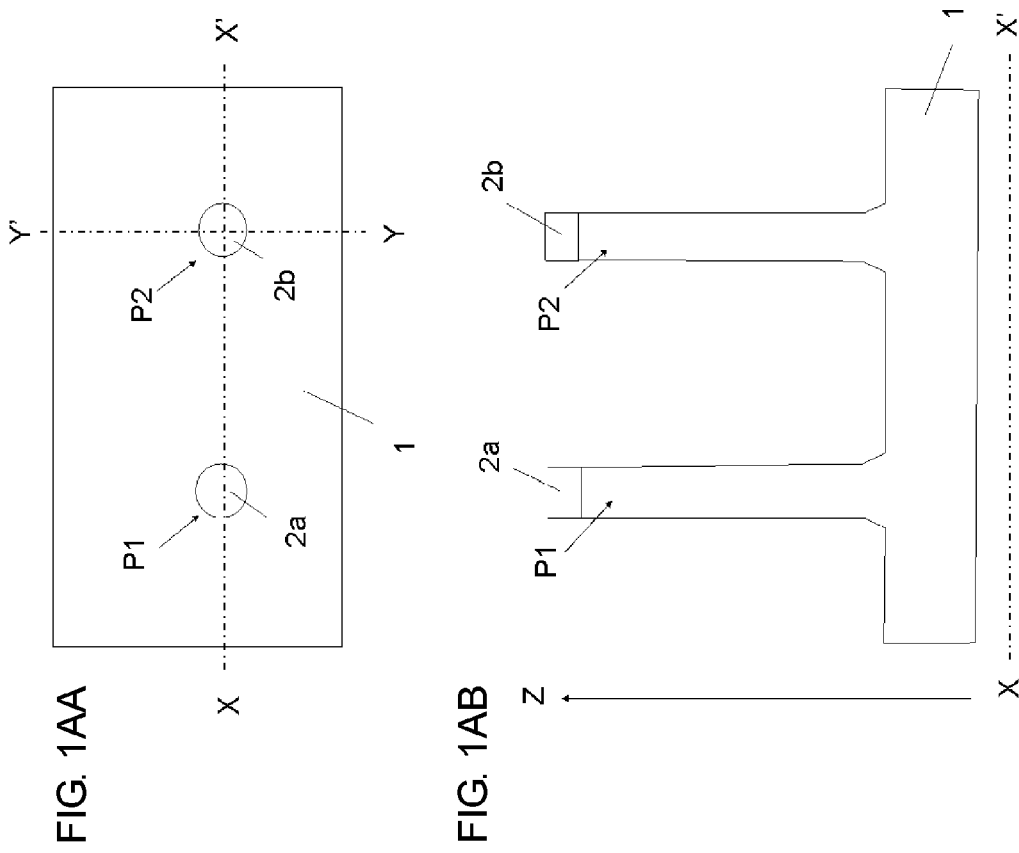
FIG. 1AA
FIG. 1AB

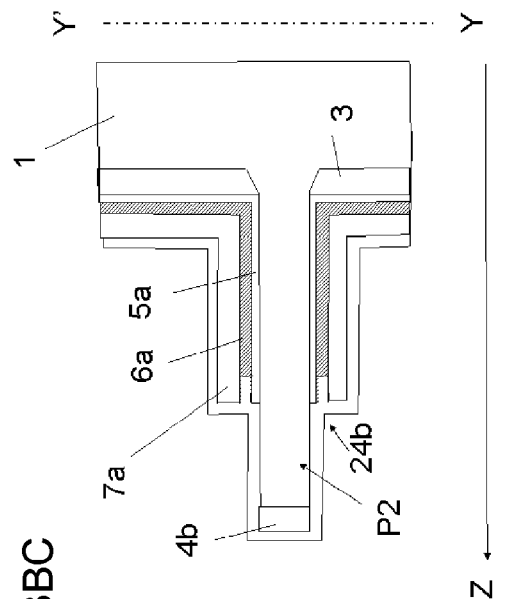
FIG. 3BC
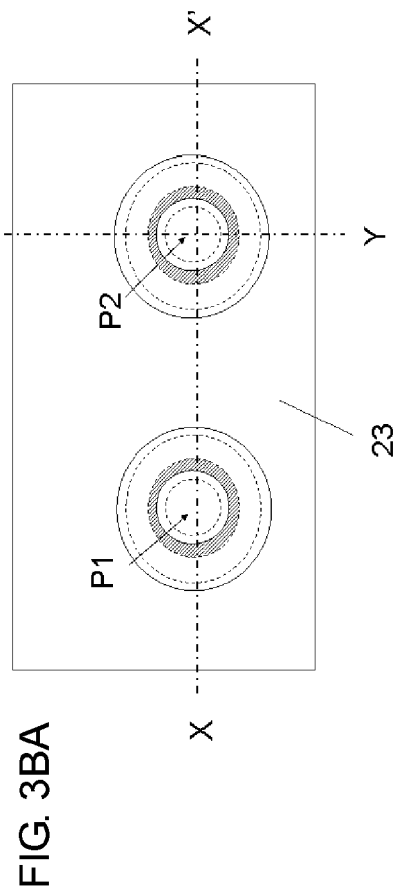
FIG. 3BA
FIG. 3BB

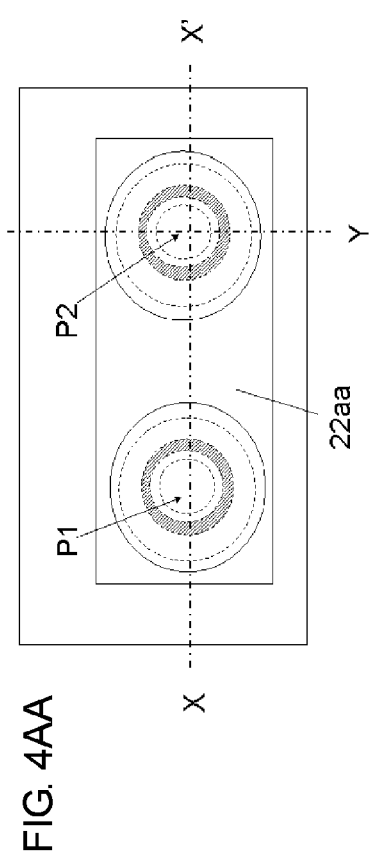
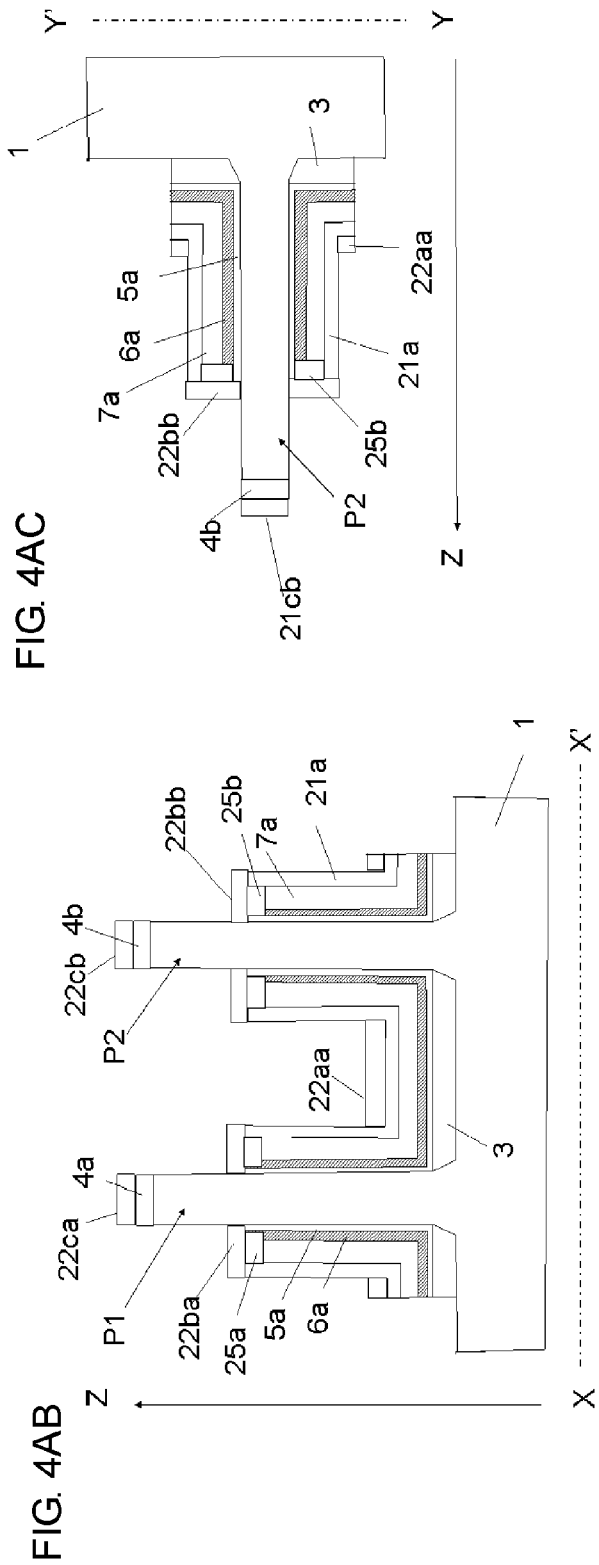
FIG. 4AA
FIG. 4AB
FIG. 4AC

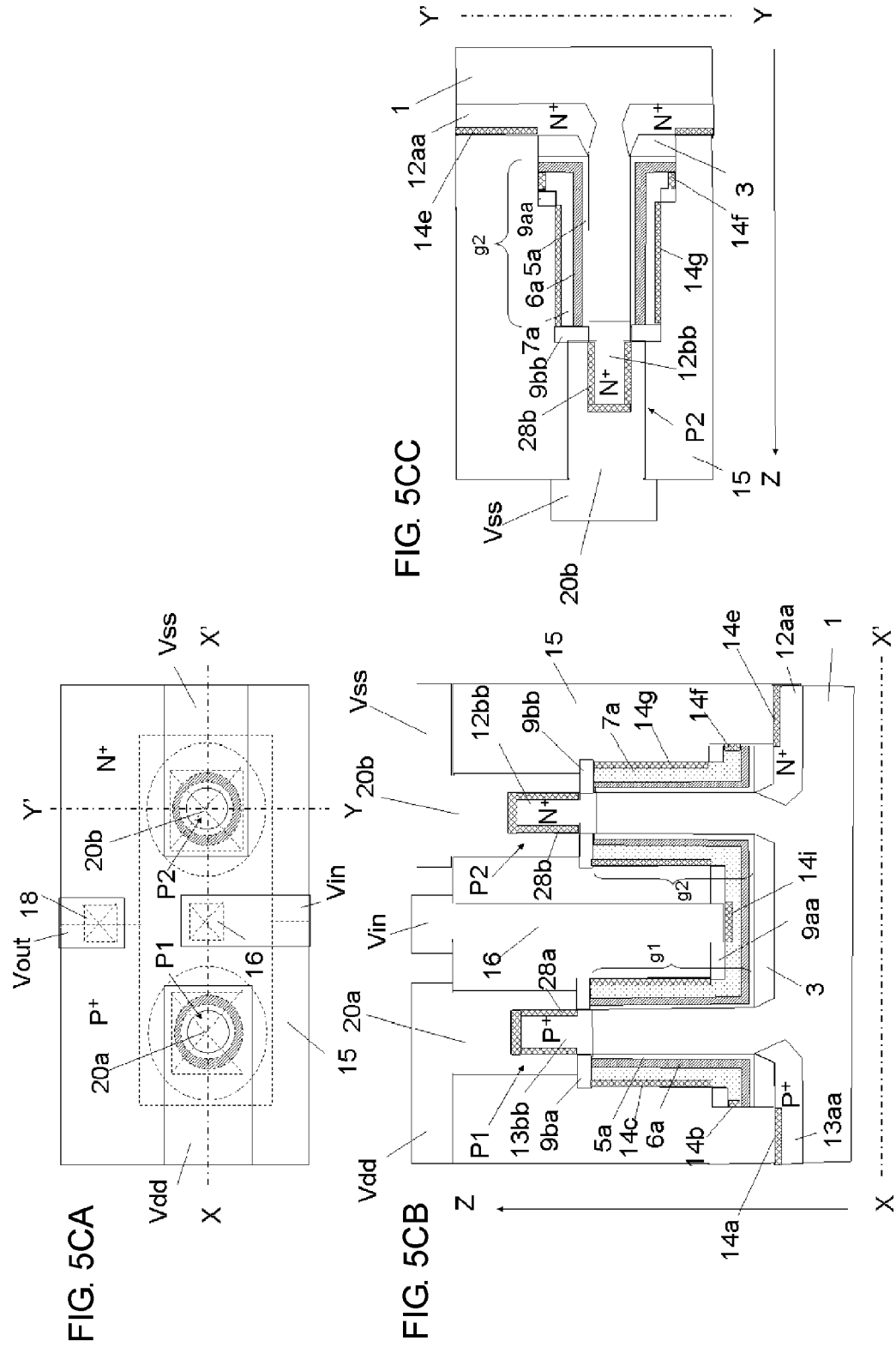

SEMICONDUCTOR DEVICE WITH AN SGT AND METHOD FOR MANUFACTURING THE SAME

CROSS-REFERENCE TO RELATED APPLICATION

This application is a continuation of patent application Ser. No. 14/735,275, filed Jun. 10, 2015 now U.S. Pat. No. 9,318,605, which was a continuation of international patent application PCT/JP2013/066320, filed Jun. 13, 2013; the entire contents of the prior applications are incorporated herein by reference.

BACKGROUND OF THE INVENTION

1. Field of the Invention

The present invention relates to a semiconductor device having a surrounding gate MOS transistor (SGT) and a method for manufacturing the semiconductor device.

2. Description of the Related Art

Recently, the use of SGTs has been increasing as semiconductor elements that provide highly integrated semiconductor devices. With this increase in the use, high-speed driving of semiconductor devices having SGTs has further been desired.

FIG. 8 shows a typical example of a complementary metal-oxide-semiconductor (CMOS) inverter circuit having metal-oxide-semiconductor (MOS) transistors. As shown in FIG. 8, this circuit includes an N-channel MOS transistor 100a and a P-channel MOS transistor 100b. A gate 101a of the N-channel MOS transistor 100a and a gate 101b of the P-channel MOS transistor 100b are connected to an input terminal $V_i$. A drain 102a of the N-channel MOS transistor 100a and a drain 102b of the P-channel MOS transistor 100b are connected to an output terminal $V_o$. A source 103b of the P-channel MOS transistor 100b is connected to a power supply wiring metal layer $V_{dd}$. A source 103a of the N-channel MOS transistor 100a is connected to a ground terminal $V_{ss}$. In this circuit, in response to the application of an input voltage corresponding to "1" or "0" to the input terminal $V_i$, an output voltage corresponding to "0" or "1" that is inverted from the input voltage is taken out from the output terminal $V_o$. Such CMOS inverter circuits are used in various circuit chips such as microprocessors. The realization of high-speed driving of circuits using CMOS inverter circuits has been desired.

FIG. 9 is a cross-sectional view of a planar CMOS inverter circuit in the related art. As shown in FIG. 9, an N-well region 105 (hereinafter, a semiconductor region that forms a P-channel MOS transistor and contains a donor impurity is referred to as "N-well region") is formed in a P-type semiconductor substrate 104 (hereinafter, a semiconductor substrate containing an acceptor impurity is referred to as "P-type semiconductor substrate"). Element isolation insulating layers 106a and 106b are each formed between a surface layer portion of the N-well region 105 and a surface layer portion of the P-type semiconductor substrate 104. A gate oxide film 107a for a P-channel MOS transistor is formed on a surface of the N-well region 105, and a gate oxide film 107b for an N-channel MOS transistor is formed on a surface of the P-type semiconductor substrate 104. A gate conductor layer 108a for the P-channel MOS transistor and a gate conductor layer 108b for the N-channel MOS transistor are respectively formed on the gate oxide film 107a and the gate oxide film 107b.

Furthermore, as shown in FIG. 9, a P$^-$ region 141a doped with a low concentration of an acceptor impurity (hereinafter, a semiconductor region containing a low concentration of an acceptor impurity is referred to as "P$^-$ region") is formed in a surface layer portion of the N-well region 105 on both the right-hand side and the left-hand side of the gate conductor layer 108a for the P-channel MOS transistor. Similarly, an N$^-$ region 141b doped with a low concentration of a donor impurity (hereinafter, a semiconductor region containing a low concentration of a donor impurity is referred to as "N$^-$ region") is formed on both sides of the gate conductor layer 108b for the N-channel MOS transistor. A sidewall insulating layer 142a is formed on the N-well region 105 on both sides of the gate conductor layer 108a. A sidewall insulating layer 142b is formed on the P-type semiconductor substrate 104 on both sides of the gate conductor layer 108b. A source P$^+$ region 109a (hereinafter, a semiconductor region containing a high concentration of an acceptor impurity is referred to as "P$^+$ region") and a drain P$^+$ region 109b of the P-channel MOS transistor are formed on both sides of the gate conductor layer 108a. A source N$^+$ region 110b (hereinafter, a semiconductor region containing a high concentration of a donor impurity is referred to as "N$^+$ region") and a drain N$^+$ region 110a are formed in surface layer portions of the P-type semiconductor substrate 104. Silicide layers 143a, 143b, 143c, and 143d are formed in surface layer portions of the source P$^+$ region 109a and the drain P$^+$ region 109b and surface layer portions of the drain N$^+$ region 110a and the source N$^+$ region 110b, respectively. A first interlayer insulating layer 111 is formed on the N-well region 105 and the P-type semiconductor substrate 104. Contact holes 112a, 112b, 112c, and 112d are respectively formed above the source P$^+$ region 109a and the drain P$^+$ region 109b and above the drain N$^+$ region 110a and the source N$^+$ region 110b with the silicide layers 143a, 143b, 143c, and 143d therebetween so as to penetrate the first interlayer insulating layer 111.

As shown in FIG. 9, a power supply wiring metal layer $V_{dd}$ formed on the first interlayer insulating layer 111 is connected to the source P$^+$ region 109a of the P-channel MOS transistor through the contact hole 112a. An output wiring metal layer $V_o$ formed on the first interlayer insulating layer 111 is connected to the drain P$^+$ region 109b of the P-channel MOS transistor through the contact hole 112b. The output wiring metal layer $V_o$ is connected to the drain N$^+$ region 110a of the N-channel MOS transistor through the contact hole 112c. A ground wiring metal layer $V_{ss}$ is connected to the source N$^+$ region 110b of the N-channel MOS transistor through the contact hole 112d. A second interlayer insulating layer 113 is formed on the first interlayer insulating layer 111. Contact holes 114a and 114b are respectively formed on the gate conductor layer 108a for the P-channel MOS transistor and the gate conductor layer 108b for the N-channel MOS transistor so as to penetrate the first interlayer insulating layer 111 and the second interlayer insulating layer 113. An input wiring metal layer $V_i$ formed on the second interlayer insulating layer 113 is connected to the gate conductor layer 108a for the P-channel MOS transistor through the contact hole 114a. The input wiring metal layer $V_i$ is connected to the gate conductor layer 108b for the N-channel MOS transistor through the contact hole 114b.

High-speed driving of many CMOS circuits including the planar CMOS inverter circuit shown in FIG. 9 has been further required. In order to realize high-speed driving of CMOS circuits, it is necessary to reduce the resistances of the drain N$^+$ region 110a and the source N$^+$ region 110b of the N-channel MOS transistor and the resistances of the source P+ region 109a and the drain P+ region 109b of the P-channel MOS transistor. For this purpose, the silicide layers 143a and 143b that are respectively formed on the source P+ region 109a and the drain P+ region 109b need to be formed so as to be close to the gate conductor layer 108a as much as possible. Similarly, the silicide layers 143c and 143d that are respectively formed on the drain N+ region 110a and the source N+ region 110b need to be formed so as to be close to the gate conductor layer 108b as much as possible. In general, a signal propagation speed of a circuit is controlled by the product RC of the resistance (R) and the capacitance (C). Accordingly, in addition to the reduction in the resistances of the drain N+ region 110a and the source N+ region 110b of the N-channel MOS transistor and the reduction in the resistances of the source P+ region 109a and the drain P+ region 109b of the P-channel MOS transistor, the coupling capacitance between the gate conductor layer 108a and the source P+ and drain P+ regions 109a and 109b is reduced by providing the sidewall insulating layer 142a between the gate conductor layer 108a and the source P+ and drain P+ regions 109a and 109b, and the coupling capacitance between the gate conductor layer 108b and the drain N+ and source N+ regions 110a and 110b is reduced by providing the sidewall insulating layer 142b between the gate conductor layer 108b and the drain N+ and source N+ regions 110a and 110b. Furthermore, it is necessary to realize the reduction in the resistances of the drain N+ region 110a, the source N+ region 110b, the source P+ region 109a, and the drain P+ region 109b, the reduction in the coupling capacitance between the gate conductor layer 108a and the source P+ and drain P+ regions 109a and 109b, and the reduction in the coupling capacitance between the gate conductor layer 108b and the drain N+ and source N+ regions 110a and 110b with a good controllability. In addition, with the realization of a high density of the planar CMOS inverter circuit shown in FIG. 9, the sizes of the drain N+ region 110a and the source N+ region 110b of the N-channel MOS transistor and the sizes of the source P+ region 109a and the drain P+ region 109b of the P-channel MOS transistor have been reduced. Therefore, improvements for realizing further reduction in the resistances and further reduction in the coupling capacitances of the drain N+ region 110a and the source N+ region 110b of the N-channel MOS transistor and the source P+ region 109a and the drain P+ region 109b of the P-channel MOS transistor have been required.

In planar MOS transistors, channels of a P-channel MOS transistor and an N-channel MOS transistor are formed between a source and a drain in a horizontal direction along the surfaces of the P-type semiconductor substrate 104 and the N-well region 105, respectively. In contrast, channels of SGTs are formed in a direction perpendicular to a surface of a semiconductor substrate (refer to, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991))

Figures 10A, 10B, 10C:
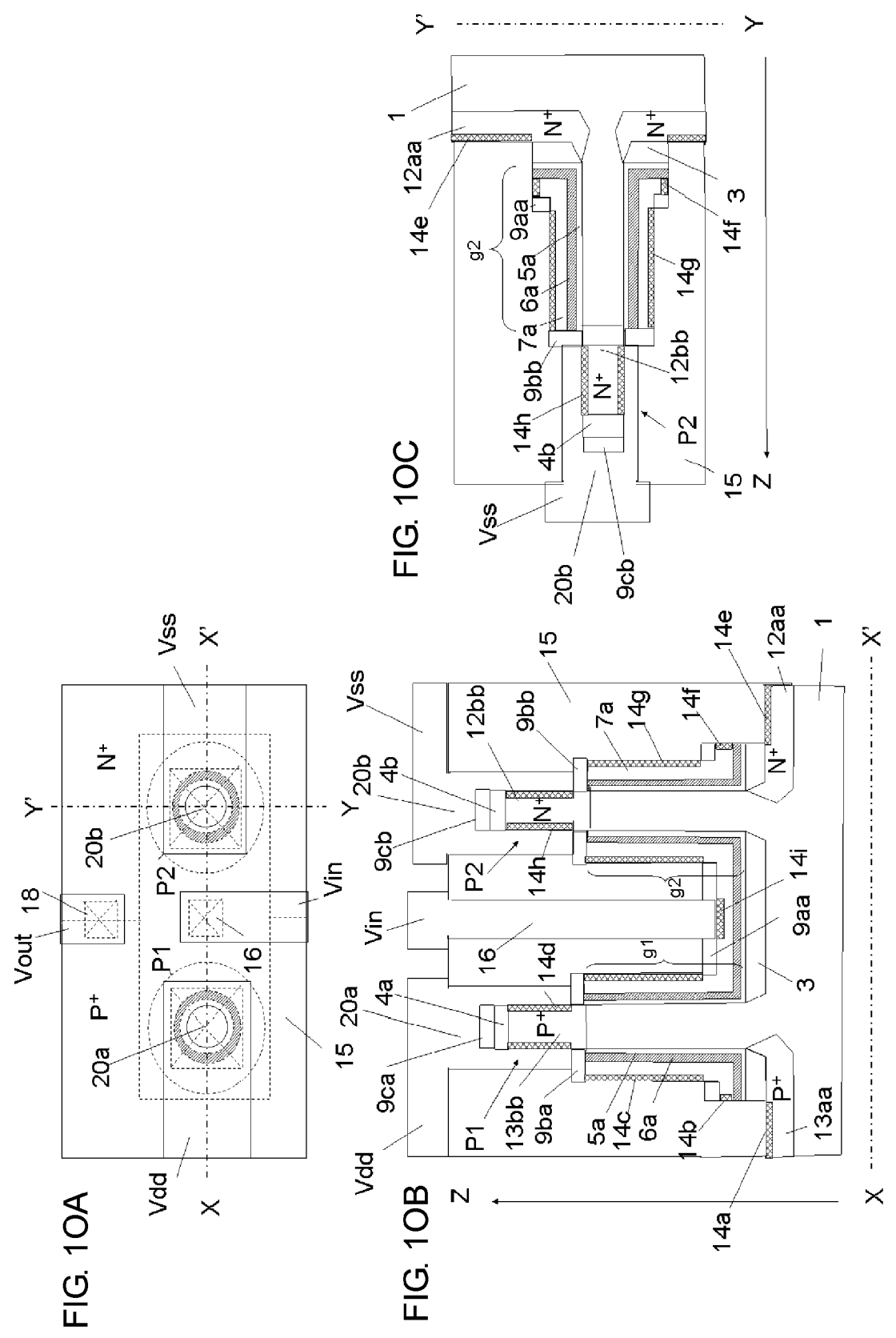

FIG. 10 is a structural schematic view of an N-channel SGT. N+ regions 116a and 116b are formed in upper and lower portions of a P-type or i-type (intrinsic) Si pillar 115 (hereinafter, a silicon semiconductor pillar is referred to as "Si pillar"). When one of the N+ regions 116a and 116b functions as a source, the other functions as a drain. When one of the N+ regions 116a and 116b functions as a drain, the other functions as a source. The Si pillar 115 located between the source/drain N+ regions 116a and 116b functions as a channel region 117. A gate insulating layer 118 is formed so as to surround the channel region 117. A gate conductor layer 119 is formed so as to surround the gate insulating layer 118. In the SGT, the source/drain N+ regions 116a and 116b, the channel region 117, the gate insulating layer 118, and the gate conductor layer 119 are formed in or on the single Si pillar 115. Therefore, the occupation area of the surface of the SGT apparently corresponds to the occupation area of a single source or drain N+ region of a planar MOS transistor. Accordingly, regarding circuit chips including SGTs, a further reduction in the chip size can be realized compared with circuit chips including planar MOS transistors.

FIG. 11 is a cross-sectional view of a CMOS inverter circuit having SGTs (refer to, for example, U.S. Patent Application Publication No. 2010/0264484). An i-layer 121 (the term "i-layer" refers to an intrinsic Si layer) is formed on an insulating layer substrate 120. A Si pillar SP1 for a P-channel SGT and a Si pillar SP2 for an N-channel SGT are formed on the i-layer 121. A drain P+ region 122 of the P-channel SGT is formed in the i-layer 121 connected to a lower portion of the Si pillar SP1 for the P-channel SGT so as to be integrated with the i-layer 121 and to surround a lower portion of the Si pillar SP1. Similarly, a drain N+ region 123 of the N-channel SGT is formed so as to be integrated with the i-layer 121 and to surround a lower portion of the Si pillar SP2. Furthermore, a source P+ region 124 of the P-channel SGT is formed in an upper portion of the Si pillar SP1 for the P-channel SGT. Similarly, a source N+ region 125 of the N-channel SGT is formed in an upper portion of the Si pillar SP2 for the N-channel SGT.

Furthermore, as shown in FIG. 11, gate insulating layers 126a and 126b are formed so as to surround the Si pillars SP1 and SP2, respectively. A gate conductor layer 127a of the P-channel SGT and a gate conductor layer 127b of the N-channel SGT are formed so as to surround the gate insulating layers 126a and 126b, respectively. Sidewall nitride films 128a and 128b which are insulating layers are formed so as to surround the gate conductor layers 127a and 127b, respectively. Similarly, sidewall nitride films 128c and 128d which are insulating layers are respectively formed so as to surround the P+ region of a top portion of the Si pillar SP1 and the N+ region of a top portion of the Si pillar SP2. The drain source P+ region 122 of the P-channel SGT is connected to the drain N+ region 123 of the N-channel SGT through a silicide layer 129d. A silicide layer 129a is formed on the source P+ region 124 of the P-channel SGT. A silicide layer 129c is formed on the source N+ region 125 of the N-channel SGT. Furthermore, silicide layers 129b and 129e are formed on a top portion of the gate insulating layer 126a and a top portion of the gate insulating layer 126b, respectively. An i-layer 130a between the P+ regions 122 and 124 that are respectively located in a lower portion and an upper portion of the Si pillar SP1 functions as a channel of the P-channel SGT. An i-layer 130b between the N+ regions 123 and 125 that are respectively located in a lower portion and an upper portion of the Si pillar SP2 functions as a channel of the N-channel SGT.

As shown in FIG. 11, a $SiO_2$ layer 131 is formed by chemical vapor deposition (CVD) so as to cover the insulating layer substrate 120, the i-layer 121, and the Si pillars SP1 and SP2. Furthermore, contact holes 132a, 132b, and 132c are respectively formed in the $SiO_2$ layer 131 on the Si pillar SP1, the drain P+ region 122 of the P-channel SGT and the drain N+ region 123 of the N-channel SGT, and the Si pillar SP2. A power supply wiring metal layer $V_{dd}$ formed on the SiO$_2$ layer 131 is connected to the source P$^+$ region 124 of the P-channel SGT and the silicide layer 129a through the contact hole 132a. An output wiring metal layer V$_o$ formed on the SiO$_2$ layer 131 is connected to the drain P$^+$ region 122 of the P-channel SGT, the drain N$^+$ region 123 of the N-channel SGT, and the silicide layer 129d through the contact hole 132b. Furthermore, a ground wiring metal layer V$_{ss}$ formed on the SiO$_2$ layer 131 is connected to the source N$^+$ region 125 of the N-channel SGT and the silicide layer 129c through the contact hole 132c. Furthermore, the gate conductor layer 127a of the P-channel SGT and the gate conductor layer 127b of the N-channel SGT are connected to an input wiring metal layer (not shown) in a state where the gate conductor layers 127a and 127b are connected to each other. In this inverter circuit having SGTs, the P-channel SGT and the N-channel SGT are respectively formed in the Si pillar SP1 and the Si pillar SP2. Therefore, the circuit area when the inverter circuit is viewed in plan view from the vertical direction is reduced. As a result, the size of the inverter circuit can be further reduced as compared with an inverter circuit having planar MOS transistors in the related art.

In the CMOS circuit having SGTs and shown in FIG. 11, high-speed driving of the circuit has been further required as in the inverter circuit having planar CMOS transistors in the related art. To realize high-speed driving of this circuit, a reduction in the resistances of the P$^+$ region 122 and N$^+$ region 123 functioning as a drain and a reduction in the resistances of the P$^+$ region 124 and N$^+$ region 125 functioning as a source is necessary. The P$^+$ regions 122 disposed in a lower portion of the Si pillar SP1 and the IT region 123 disposed in a lower portion of the Si pillar SP2 are connected to the output wiring metal layer V$_o$ through the silicide layer 129d disposed on outer peripheries of the Si pillars SP1 and SP2 and having a relatively large occupation area. On the other hand, the P$^+$ region 124 disposed in the top portion of the Si pillar SP1 is connected to the power supply wiring metal layer V$_{dd}$ through the silicide layer 129a formed on a surface of the top portion of the P$^+$ region 124 and having a relatively small occupation area. Similarly, the N$^+$ region 125 disposed in the top portion of the Si pillar SP2 is connected to the ground wiring metal layer V$_{ss}$ through the silicide layer 129c formed on a surface of the top portion of the N$^+$ region 125 and having a relatively small occupation area. Therefore, when the density of the circuit is further increased, the diameters (widths) of the Si pillars SP1 and SP2 are reduced accordingly. As a result, a problem of an increase in the resistances of the P$^+$ region 124 and the N$^+$ region 125 occurs.

In general, a signal propagation speed of a circuit is controlled by the product RC of the resistance (R) and the capacitance (C). Accordingly, it is necessary to reduce not only the resistances of the P$^+$ region 124 and the N$^+$ region 125 that are respectively disposed on the top portions of the Si pillars SP1 and SP2 but also the coupling capacitances between the P$^+$ region 124 and the gate conductor layer 127a and between the N$^+$ region 125 and the gate conductor layer 127b. Furthermore, it is also necessary to provide a structure for realizing, with a good controllability, the reduction in the resistances of the P$^+$ region 124 and the N$^+$ region 125 and the reduction in the coupling capacitances between the P$^+$ region 124 and the gate conductor layer 127a and between the N$^+$ region 125 and the gate conductor layer 127b.

With regard to the reduction in the resistances of a source and a drain in top portions of Si pillars SP1 and SP2, for example, Japanese Unexamined Patent Application Publication Nos. 2011-40421 and 2004-186601 disclose technologies that the resistances of a source and a drain of SGTs are reduced by connecting side faces of impurity regions to lead-out wirings, the impurity regions being formed in top portions of Si pillars SP1 and SP2 and functioning as a source or a drain. In these technologies, the relationship of a lower position of a side face of a Si pillar where a lead-out wiring is connected to an impurity region, a position of an end of a source or drain impurity region that is in contact with a channel region, and a position of an upper end of a gate conductor layer is not determined by a self-alignment in which, when the position of the upper end of the gate conductor layer is determined, the position of the end of the source or and drain impurity region is determined. Accordingly, it is necessary to realize, with a good controllability, a reduction in the resistances of the source and the drain and a reduction in the coupling capacitances between the impurity region functioning as the source and the gate conductor layer and between the impurity region functioning as the drain and the gate conductor layer. In addition, in Japanese Unexamined Patent Application Publication No. 2011-40421, a thickness of a wiring metal layer connected to an impurity region in a side face of a Si pillar is equal to a thickness of a gate insulating layer. With an increase in the density of the circuit, the thickness of the gate insulating layer is reduced to 2 to 3 nm. Accordingly, in this case, it may be technically difficult to embed the wiring metal layer in a contact hole and the resistance of this wiring metal layer having a small thickness may increase.

SUMMARY OF THE INVENTION

An object of the present invention is to provide a semiconductor device having an SGT, the semiconductor device capable of realizing high-speed driving of a circuit.

A semiconductor device having a surrounding gate transistor (SGT) according to a first aspect of the present invention includes a semiconductor pillar formed on a substrate; a first impurity region formed in a lower part of the semiconductor pillar and containing a donor or acceptor impurity; a second impurity region formed in a top portion of the semiconductor pillar, the second impurity region being disposed above the first impurity region, containing a donor or acceptor impurity, and having the same conductivity type as the first impurity region; a first insulating layer surrounding an outer periphery of the semiconductor pillar between the first impurity region and the second impurity region; a first conductor layer surrounding an outer periphery of the first insulating layer; an electrically conductive or nonconductive first material layer surrounding an outer periphery of the first conductor layer; a second insulating layer which is disposed at a position higher than first conductor layer and is in contact with an upper end surface of the first material layer; a third insulating layer covering the substrate and the semiconductor pillar; a contact hole formed in the third insulating layer, surrounding the top portion of the semiconductor pillar, and having a bottom portion that is in contact with a surface layer portion of the second insulating layer, in which an outer periphery of the bottom portion is located inside an outer periphery of the first material layer in plan view; and a second conductor layer that is, in the contact hole, in contact with the surface layer portion of the second insulating layer and in contact with a side face of the top portion of the semiconductor pillar in which the second impurity region is formed. In the semiconductor device, an SGT is formed in which one of the first impurity region and the second impurity region functions as a source and the other functions as a drain, a part of the semiconductor pillar between the first impurity region and the second impurity region functions as a channel, the first insulating layer functions as a gate insulating layer, the first conductor layer functions as a gate conductor layer, and the second conductor layer is electrically connected to the second impurity region located in the top portion of the semiconductor pillar.

The semiconductor device preferably further includes an electrically conductive or nonconductive second material layer surrounding the outer periphery of the first conductor layer and disposed inside the first material layer, in which the second insulating layer is formed at a position higher than the second material layer.

The semiconductor device preferably further includes a fifth insulating layer disposed between the first conductor layer and the second insulating layer.

The semiconductor device preferably further includes a sixth insulating layer disposed between the second material layer and the second insulating layer.

Electrical connection between the second impurity region and the second conductor layer is preferably established through an alloy layer that contains a semiconductor atom contained in the second impurity region and a metal atom and that is formed in the semiconductor pillar and connected to the contact hole. The second impurity region is preferably in contact with the alloy layer. A lower end of the second impurity region is preferably located at a height of an upper end of the first conductor layer.

The alloy layer is preferably formed in all parts of the top portion of the semiconductor pillar.

An outer periphery of the contact hole preferably has a circular shape when viewed from above an upper surface of the semiconductor substrate.

A method for manufacturing a semiconductor device having a surrounding gate transistor (SGT) according to a second aspect of the present invention includes a semiconductor pillar forming step of forming a semiconductor pillar on a substrate; a first impurity region forming step of forming a first impurity region in a lower part of the semiconductor pillar, the first impurity region containing a donor or acceptor impurity; a second impurity region forming step of forming a second impurity region in a top portion of the semiconductor pillar, the second impurity region being disposed above the first impurity region, containing a donor or acceptor impurity, and having the same conductivity type as the first impurity region; a first insulating layer forming step of forming a first insulating layer so as to surround an outer periphery of the semiconductor pillar between a region where the first impurity region is formed and a region where the second impurity region is formed; a first material layer forming step of forming a first conductor layer so as to surround an outer periphery of the first insulating layer and forming an electrically conductive or nonconductive first material layer so as to surround an outer periphery of the first conductor layer; a second insulating layer forming step of forming a second insulating layer so as to be disposed at a position higher than the first conductor layer and in contact with an upper end surface of the first material layer and so that an outer peripheral edge of the second insulating layer is substantially aligned with an outer peripheral edge of the first material layer; a third insulating layer forming step of forming a third insulating layer so as to cover the substrate and the semiconductor pillar; a contact hole forming step of forming a contact hole in the third insulating layer so as to surround the top portion of the semiconductor pillar and to have a bottom portion that is in contact with a surface layer portion of the second insulating layer and so that an outer periphery of the bottom portion is located inside an outer periphery of the first material layer in plan view; and a second conductor layer forming step of forming, in the contact hole, a second conductor layer so as to be in contact with the surface layer portion of the second insulating layer and to be in contact with a side face of the top portion of the semiconductor pillar in which the second impurity region is formed. In the method, an SGT is formed in which one of the first impurity region and the second impurity region functions as a source and the other functions as a drain, a part of the semiconductor pillar between the first impurity region and the second impurity region functions as a channel, the first insulating layer functions as a gate insulating layer, the first conductor layer functions as a gate conductor layer, and the second conductor layer is electrically connected to the second impurity region located in the top portion of the semiconductor pillar.

After the second insulating layer is formed, the second impurity region is preferably formed in the top portion of the semiconductor pillar by using the second insulating layer as a mask.

The contact hole forming step is preferably conducted in a plasma atmosphere which contains an etching ion and in which an etching rate of the third insulating layer is higher than an etching rate of the second insulating layer.

The method preferably further includes a fourth insulating layer forming step of forming a fourth insulating layer so as to surround the outer periphery of the first conductor layer, in which, in the second insulating layer forming step, the second insulating layer is formed so as to be disposed on the first conductor layer and in contact with an upper end surface of the fourth insulating layer.

The method preferably further includes a fifth insulating layer forming step of forming a fifth insulating layer between the first conductor layer and the second insulating layer.

The fifth insulating layer forming step preferably includes an etching stopper layer forming step of forming an etching stopper layer so as to surround the outer periphery of the first conductor layer, an etching step of removing an upper end portion of the first conductor layer by using the etching stopper layer as an etching mask, an insulating layer forming step of covering the whole of the semiconductor substrate and the semiconductor pillar with an insulating layer, and a step of etching the insulating layer by isotropic plasma etching to form the fifth insulating layer on an upper end of the first conductor layer. In this case, a thickness of the fifth insulating layer is preferably larger than ½ of a thickness of the first conductor layer.

The method preferably further includes a silicide layer forming step of forming a silicide layer in the semiconductor pillar so as to be connected to the contact hole, the silicide layer electrically connecting the second impurity region and the second conductor layer.

The silicide layer is preferably formed in all parts of the top portion of the semiconductor pillar so as to be connected to the contact hole, and the second impurity region is preferably formed so as to be in contact with the silicide layer and so that a lower end of the second impurity region is located at a height of an upper end of the first conductor layer.

The contact hole is preferably formed so that an outer periphery of the contact hole has a circular shape when viewed from above an upper surface of the semiconductor substrate.

According to the present invention, it is possible to provide a semiconductor device having an SGT, the semiconductor device capable of realizing high-speed driving of a circuit.

BRIEF DESCRIPTION OF THE DRAWINGS

FIG. 1A(a) is a plan view and FIGS. 1A(b) and 1A(c) are cross-sectional views of a CMOS inverter circuit, the views illustrating a method for manufacturing a semiconductor device having SGTs according to a first embodiment;

FIGS. 1O(a), 1O(b), and 1O(c) include a plan view and cross-sectional views of the CMOS inverter circuit, the views illustrating the method for manufacturing a semiconductor device having SGTs according to the first embodiment;

FIGS. 3B(a), 3B(b), and 3B(c) are a plan view and cross-sectional views of the CMOS inverter circuit, the views illustrating the method for manufacturing a semiconductor device having SGTs according to the third embodiment;

FIG. 4A(a) is a plan view and FIGS. 4A(b) and 4A(c) are cross-sectional views of a CMOS inverter circuit, the views illustrating a method for manufacturing a semiconductor device having SGTs according to the third embodiment;

FIGS. 5C(a), 5C(b), and 5C(c) are a plan view and cross-sectional views of the CMOS inverter circuit, the views illustrating the method for manufacturing a semiconductor device having SGTs according to the fourth embodiment;

FIG. 6(a) is a plan view and FIGS. 6(b) and 6(c) are cross-sectional views of a CMOS inverter circuit, the views illustrating a method for manufacturing a semiconductor device having SGTs according to a fifth embodiment;

DESCRIPTION OF THE PREFERRED EMBODIMENTS

Methods for manufacturing a semiconductor device having SGTs according to embodiments of the present invention will now be described with reference the drawings.

First Embodiment

FIGS. 1A to 1O show a method for manufacturing a CMOS inverter circuit having SGTs according to a first embodiment of the present invention.

FIG. 1A includes a plan view and cross-sectional views illustrating a first step of manufacturing a CMOS inverter circuit having SGTs. In FIG. 1A, part (a) is a plan view, part (b) is a cross-sectional view taken along line X-X' of part (a), and part (c) is a cross-sectional view taken along line Y-Y' of part (a). In respective drawings referred to in the description below, the relationships between part (a), part (b), and part (c) are the same as those in FIG. 1A.

As shown in FIG. 1A, $SiO_2$ layers 2a and 2b are formed on an i-layer substrate 1 by a thermal oxidation process. Subsequently, Si pillars P1 and P2 are formed by, for example, reactive ion etching (RIE) using the $SiO_2$ layers 2a and 2b, respectively, as an etching mask.

Figure 1B:
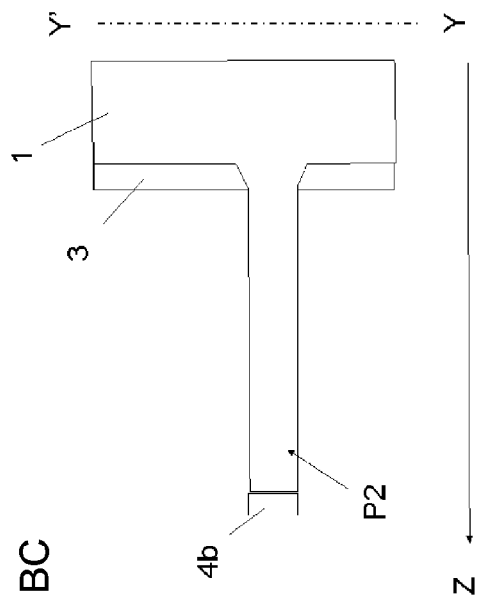
FIGS. 1B(a), 1B(b), and 1B(c) include a plan view and cross-sectional views of the CMOS inverter circuit, the views illustrating the method for manufacturing a semiconductor device having SGTs according to the first embodiment.
Figure 1B:
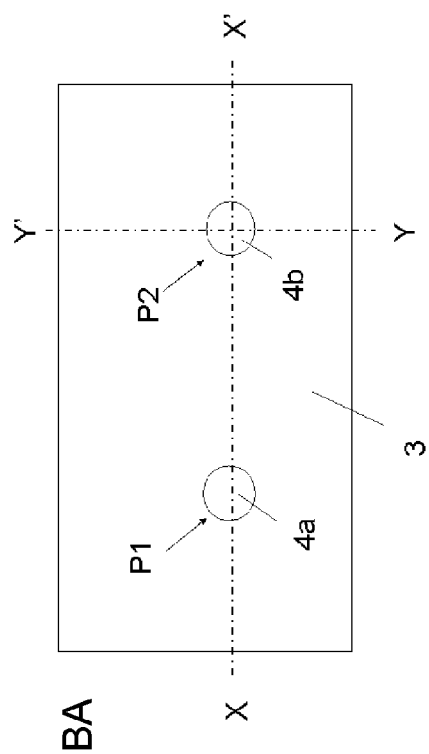
Figure 1B:
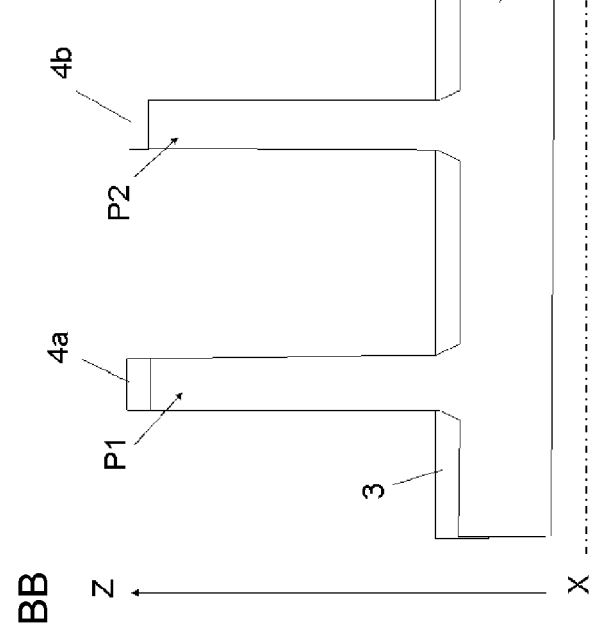

Next, as shown in FIG. 1B, a $SiO_2$ layer is deposited on the i-layer substrate 1 and the Si pillars P1 and P2 by chemical vapor deposition (CVD). Subsequently, the whole $SiO_2$ layer is etching by isotropic plasma etching. Thus, the $SiO_2$ layer on the side faces of the Si pillars P1 and P2 is removed so that a $SiO_2$ layer 3 is left on the i-layer substrate 1, a $SiO_2$ layer 4a is left on a top portion of the Si pillar P1, and a $SiO_2$ layer 4b is left on a top portion of the Si pillar P2. In this step, for the purpose of leaving the $SiO_2$ layers 3, 4a, and 4b, a $SiO_2$ film is deposited by CVD. This is because, by using CVD, the $SiO_2$ film is deposited so as to have a relatively small thickness on the side faces of the Si pillars P1 and P2 and a relatively large thickness on the i-layer substrate 1.

Figure 1C:
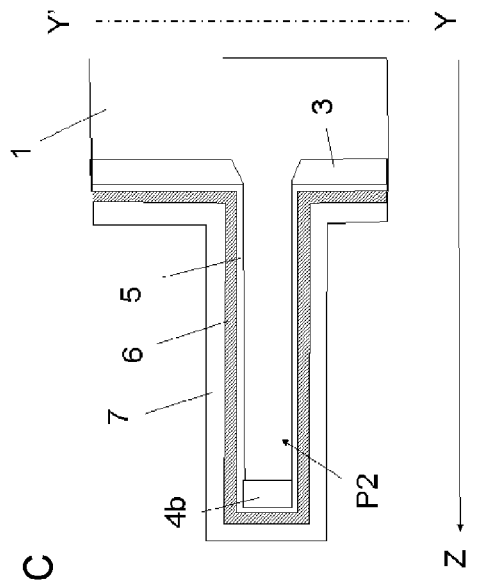
FIGS. 1C(a), 1C(b), and 1C(c) include a plan view and cross-sectional views of the CMOS inverter circuit, the views illustrating the method for manufacturing a semiconductor device having SGTs according to the first embodiment.
Figure 1C:
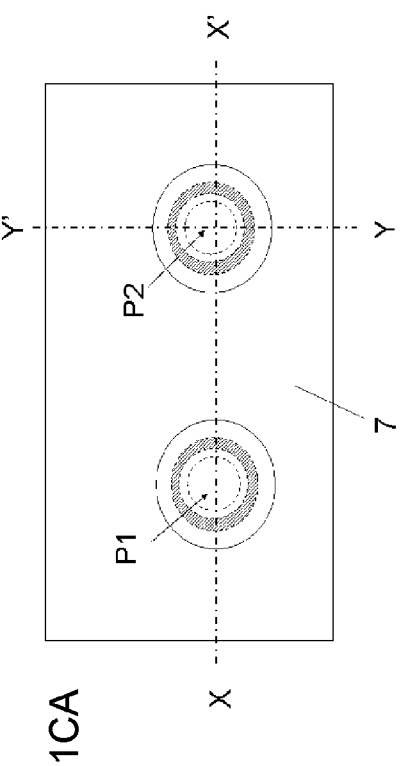
Figure 1C:
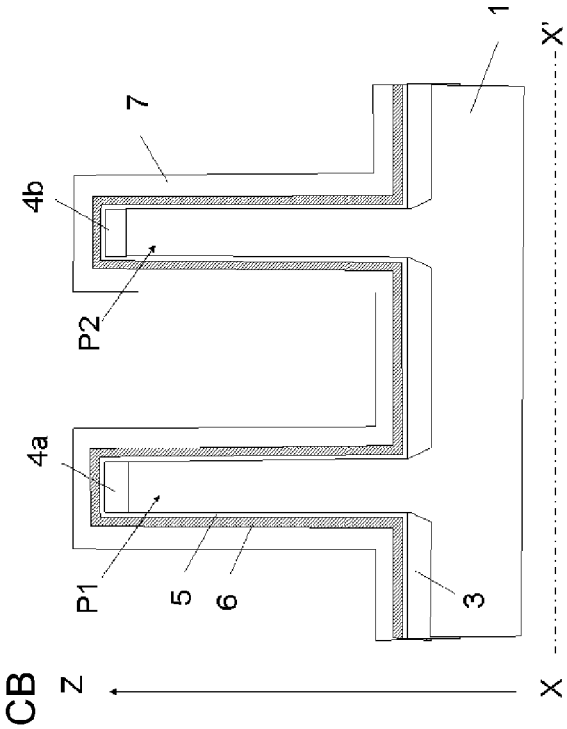

Subsequently, as shown in FIG. 1C, a HfO layer 5 (hafnium oxide layer) functioning as a gate insulating layer, a TiN layer 6 (titanium nitride layer) functioning as a gate metal layer, and a poly-Si layer 7 doped with a donor or an acceptor are formed by, for example, atomic layer deposition (ALD) or CVD so as to cover the whole of the $SiO_2$ layer 3 and the Si pillars P1 and P2.

Figure 1D:
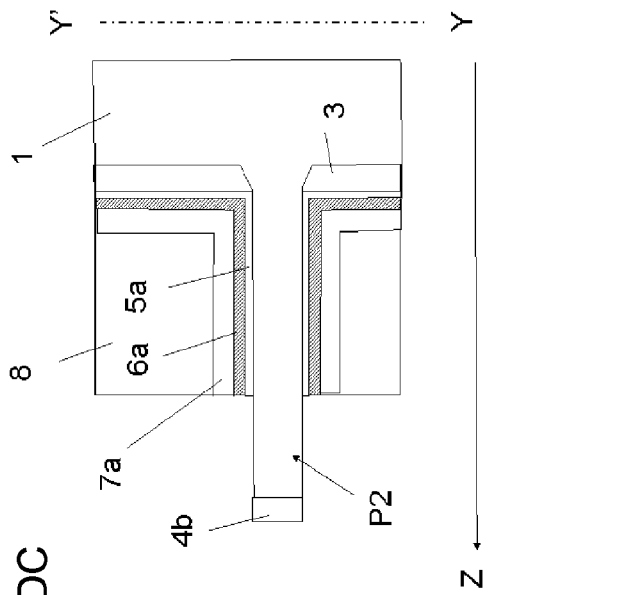
FIGS. 1D(a), 1D(b), and 1D(c) include a plan view and cross-sectional views of the CMOS inverter circuit, the views illustrating the method for manufacturing a semiconductor device having SGTs according to the first embodiment.
Figure 1D:
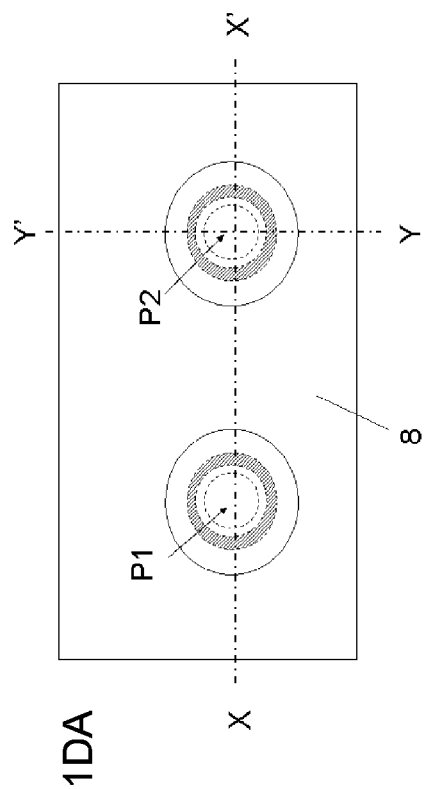
Figure 1D:
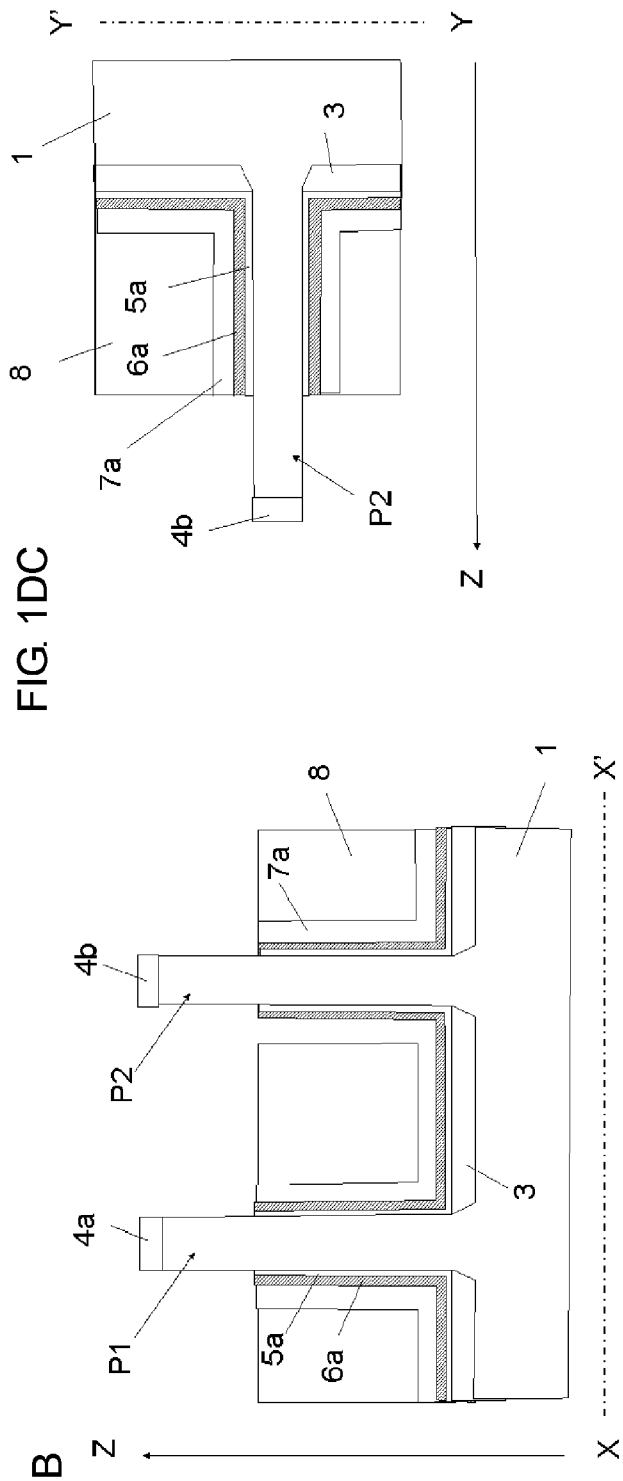

Subsequently, as shown in FIG. 1D, a resist is applied so as to cover the whole of the i-layer substrate 1 and the Si pillars P1 and P2, and the surface of the resist is uniformly etched by an etch-back process. As a result, a resist layer 8 whose surface is located at a particular position in a height direction of the Si pillars P1 and P2 is formed. Subsequently, the poly-Si layer 7, the TiN layer 6, and the HfO layer 5 exposed to an upper portion of the Si pillars P1 and P2 are etched by using the resist layer 8 as an etching mask to leave a poly-Si layer 7a, a TiN layer 6a, and a HfO layer 5a. In this step, the $SiO_2$ layers 4a and 4b are left on the top portions of the Si pillars P1 and P2, respectively. The resist layer 8 is then removed.

Figure 1E:
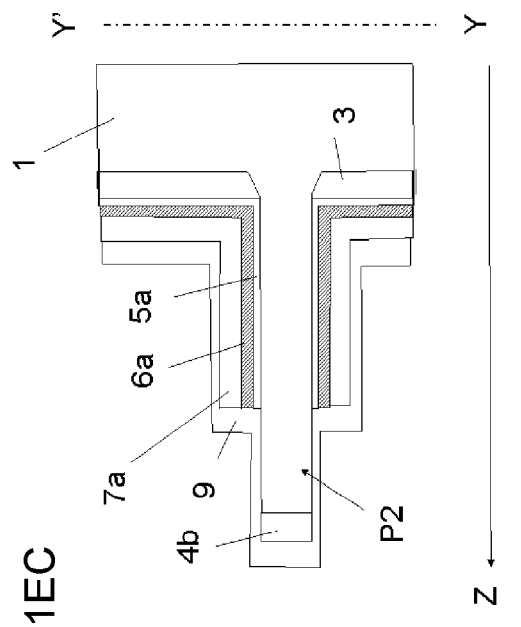
FIGS. 1E(a), 1E(b), and 1E(c) include a plan view and cross-sectional views of the CMOS inverter circuit, the views illustrating the method for manufacturing a semiconductor device having SGTs according to the first embodiment.
Figure 1E:
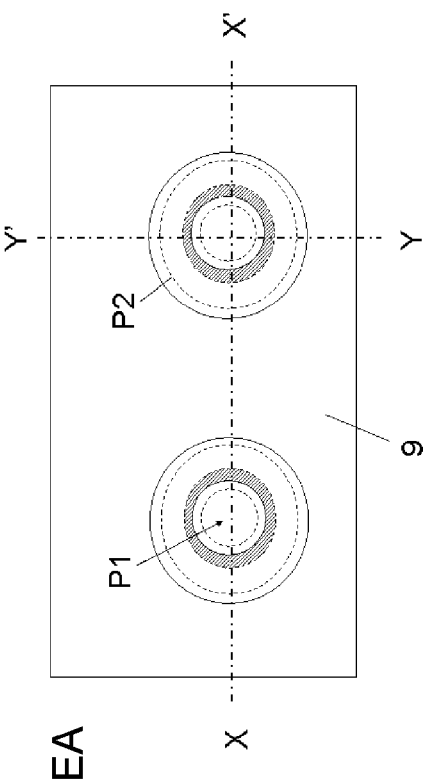
Figure 1E:
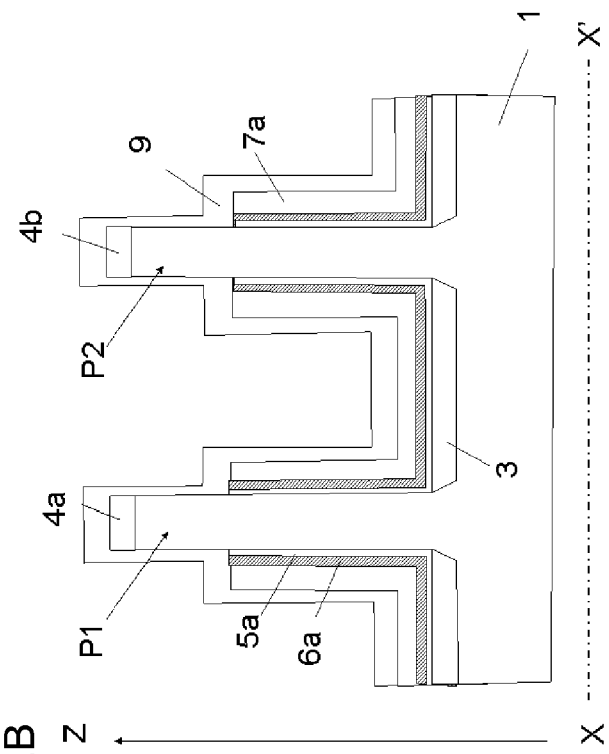

Subsequently, as shown in FIG. 1E, a HfO layer 9 is formed by CVD so as to cover the whole of the Si pillars P1 and P2 and the poly-Si layer 7a on the i-layer substrate 1.

Figure 1F:
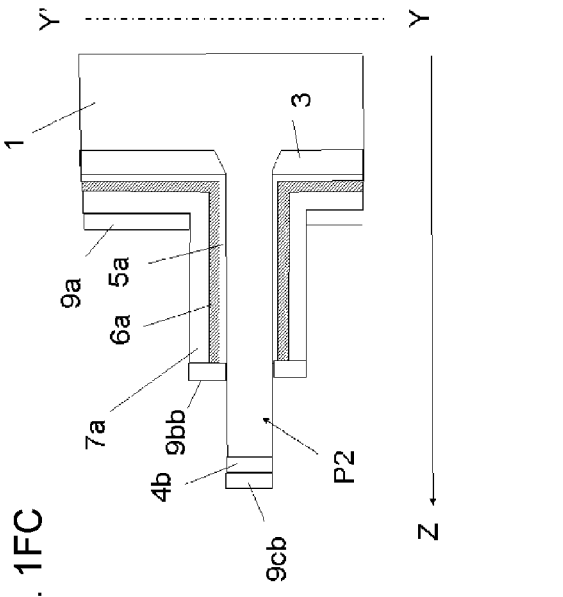
FIGS. 1F(a), 1F(b), and 1F(c) include a plan view and cross-sectional views of the CMOS inverter circuit, the views illustrating the method for manufacturing a semiconductor device having SGTs according to the first embodiment.
Figure 1F:
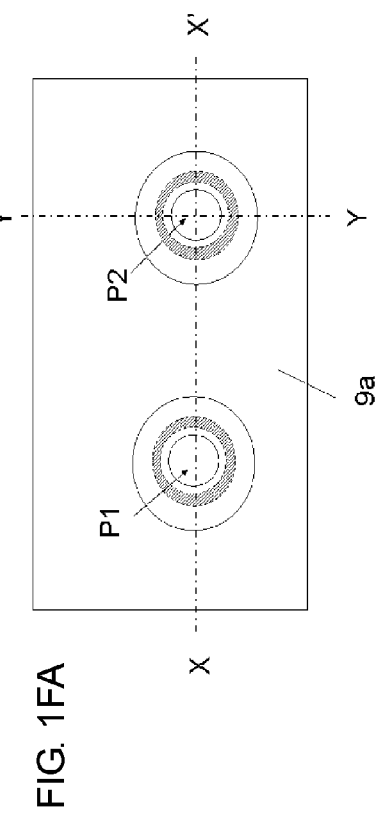
Figure 1F:

Subsequently, as shown in FIG. 1F, the HfO layer 9 on the side faces of the Si pillars P1 and P2 is removed by plasma etching. Thus, HfO layers 9a, 9ba, 9bb, 9ca, and 9cb are respectively formed on the poly-Si layer 7a on the i-layer substrate 1, upper end surfaces of the poly-Si layer 7a, the TiN layer 6a, and the HfO layer 5a that surround the Si pillars P1 and P2, and flat portions above the Si pillars P1 and P2.

Figure 1G:
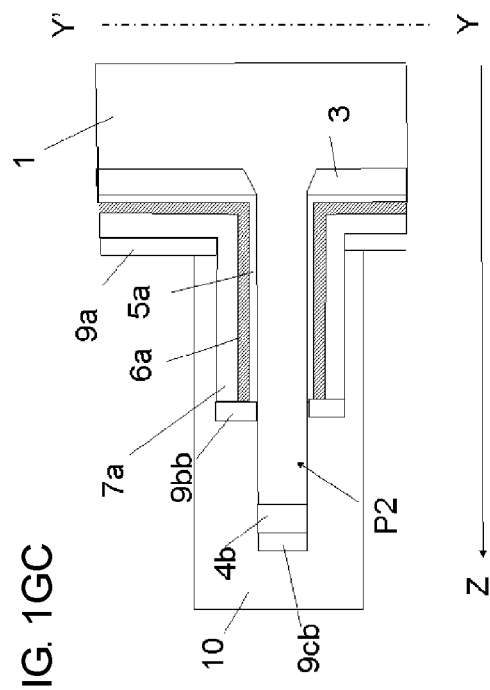
FIGS. 1G(a), 1G(b), and 1G(c) include a plan view and cross-sectional views of the CMOS inverter circuit, the views illustrating the method for manufacturing a semiconductor device having SGTs according to the first embodiment.
Figure 1G:
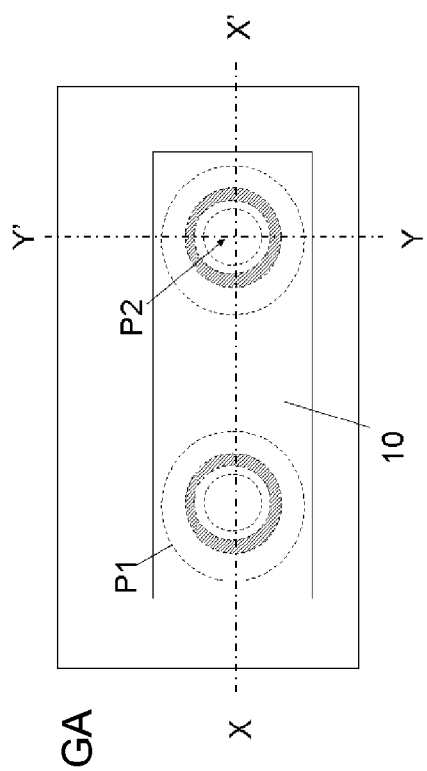
Figure 1G:
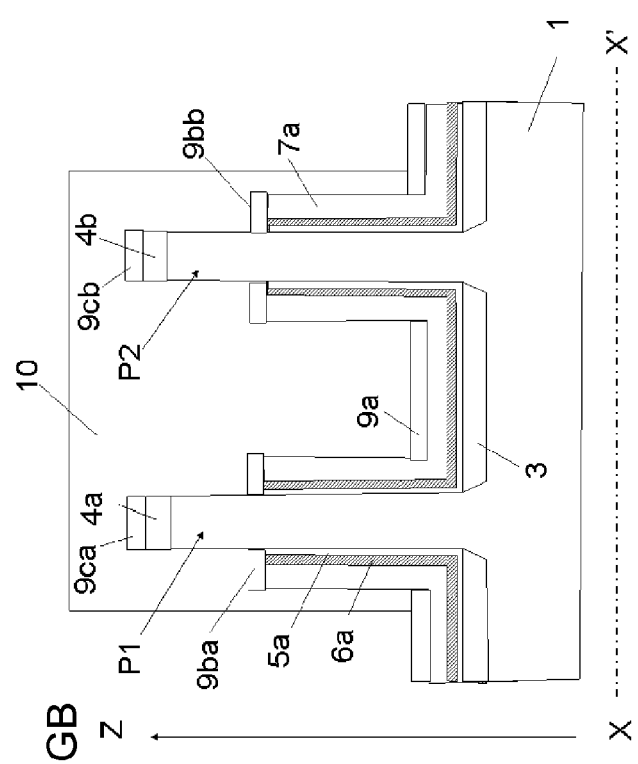

Subsequently, as shown in FIG. 1G, a resist layer 10 is formed by lithography so as to cover the Si pillars P1 and P2 and the HfO layer 9a formed between the Si pillars P1 and P2.

Figure 1H:
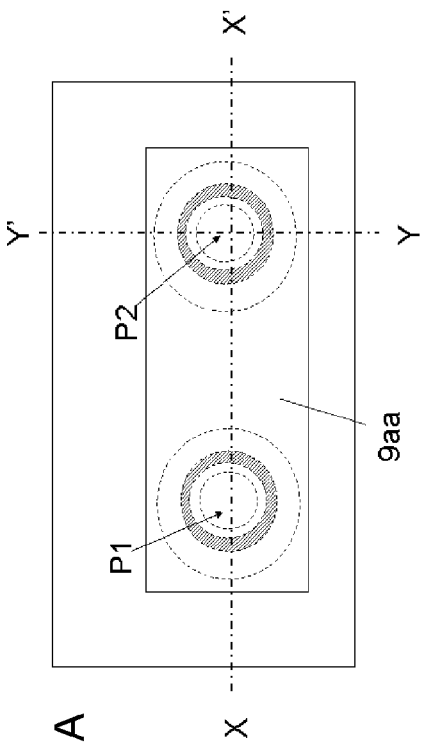
FIGS. 1H(a), 1H(b), and 1H(c) include a plan view and cross-sectional views of the CMOS inverter circuit, the views illustrating the method for manufacturing a semiconductor device having SGTs according to the first embodiment.
Figure 1H:
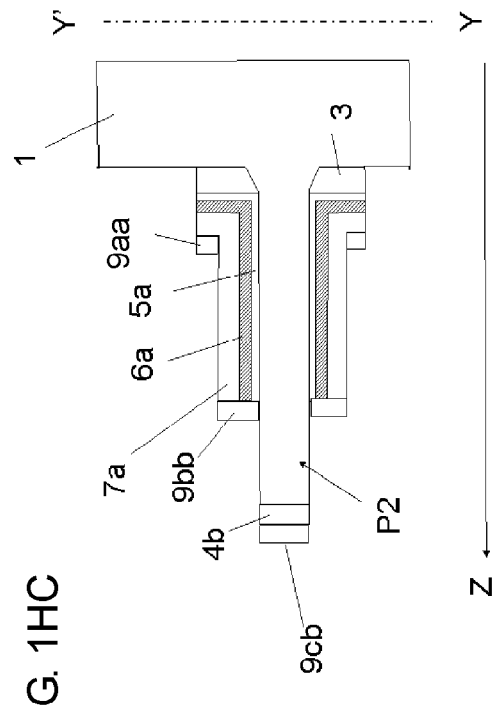
Figure 1H:

Subsequently, as shown in FIG. 1H, the HfO layer 9a, the poly-Si layer 7a, the TiN layer 6a, the HfO layer 5a, and the $SiO_2$ layer 3 are etched by using the resist layer 10 as an etching mask. As a result, the HfO layer 9a is left as an HfO layer 9aa. The resist layer 10 is then removed.

Figure 1I:
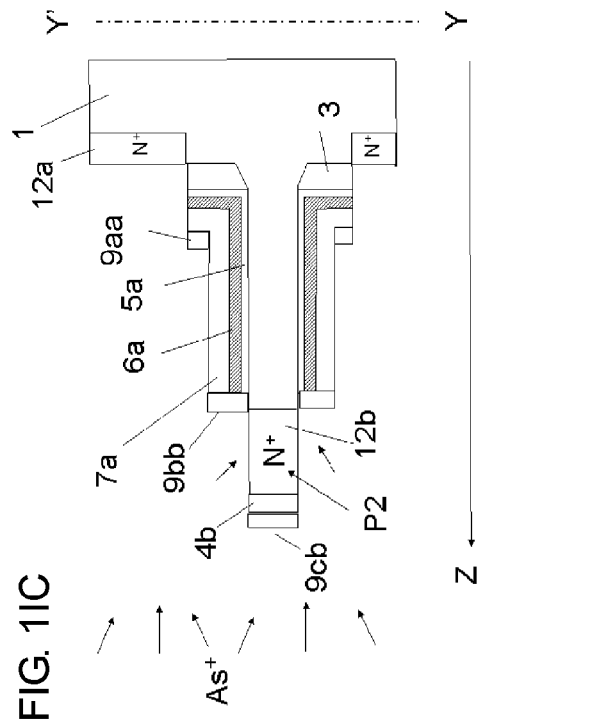
FIGS. 1I(a), 1I(b), and 1I(c) include a plan view and cross-sectional views of the CMOS inverter circuit, the views illustrating the method for manufacturing a semiconductor device having SGTs according to the first embodiment.
Figure 1I:
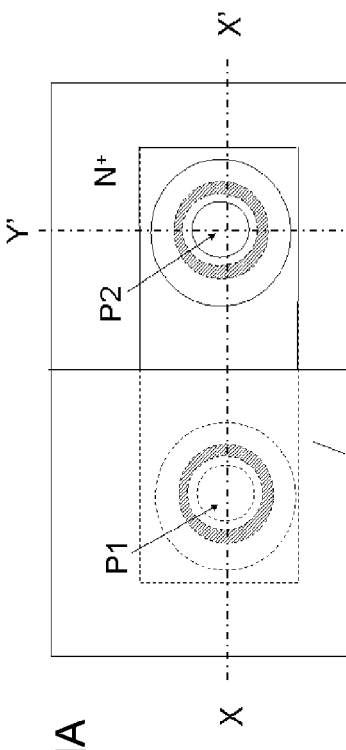
Figure 1I:
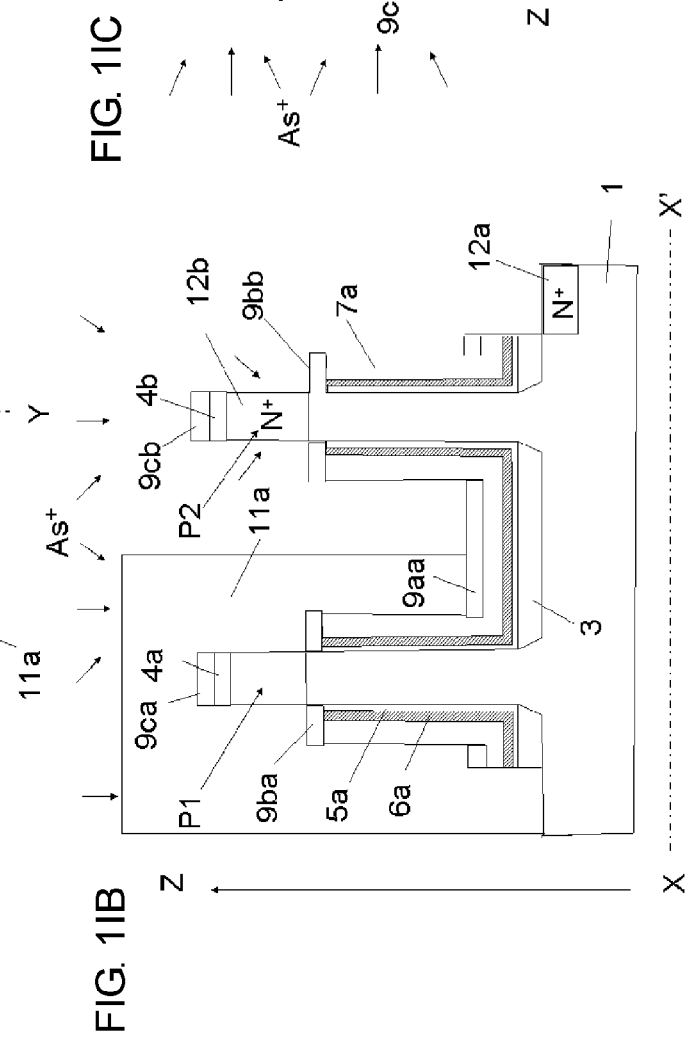

Subsequently, as shown in FIG. 1I, a resist layer 11a is formed by lithography so as to cover an outer periphery of the Si pillar P1. Subsequently, arsenic (As) is ion-implanted from the entire upper surface of the i-layer substrate 1. This ion implantation is performed from two directions, namely, a direction perpendicular to the i-layer substrate 1 and an oblique direction with respect to the i-layer substrate 1. Consequently, $N^+$ regions 12a and 12b are respectively formed in a surface layer portion of the i-layer substrate 1 that is exposed without being covered with the resist layer 11a and a top portion of the Si pillar P2 by using the HfO layers 9aa, 9bb, and 9cb as a mask. The resist layer 11a is then removed.

Figure 1J:
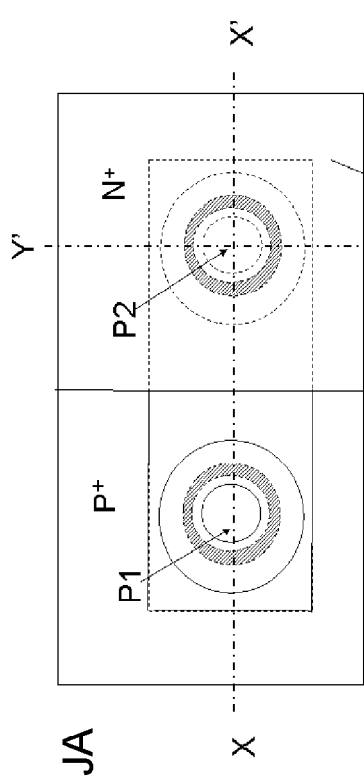
FIGS. 1J(a), 1J(b), and 1J(c) include a plan view and cross-sectional views of the CMOS inverter circuit, the views illustrating the method for manufacturing a semiconductor device having SGTs according to the first embodiment.
Figure 1J:
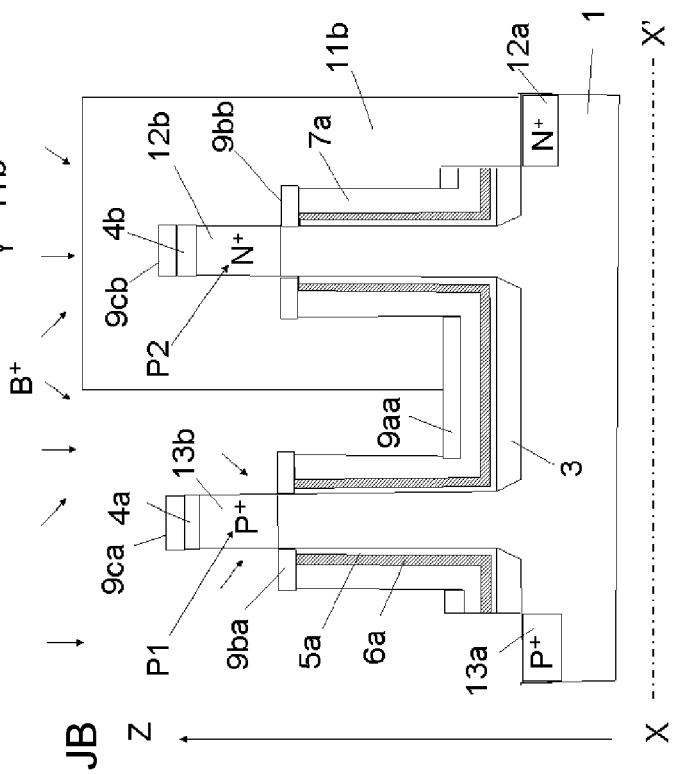
Figure 1J:
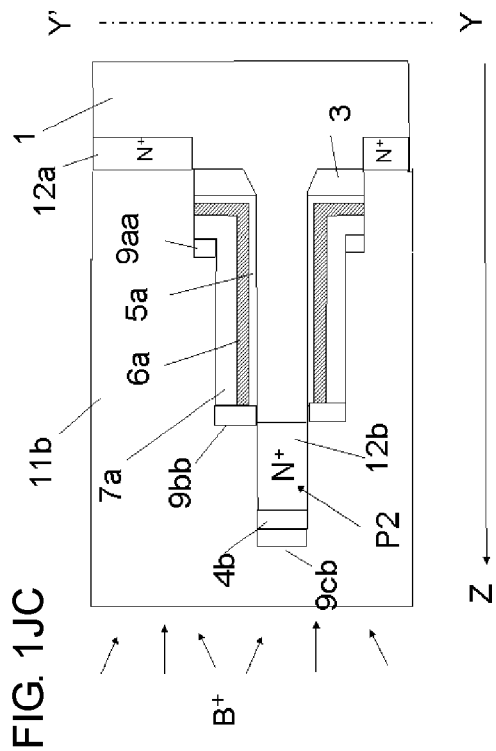

Subsequently, as shown in FIG. 1J, a resist layer 11b is formed by lithography so as to cover an outer periphery of the Si pillar P2. Subsequently, boron (B) is ion-implanted from the entire upper surface of the i-layer substrate 1. This ion implantation is performed from two directions, namely, a direction perpendicular to the i-layer substrate 1 and an oblique direction with respect to the i-layer substrate 1. Consequently, P+ regions 13a and 13b are respectively formed in a surface layer portion of the i-layer substrate 1 that is exposed without being covered with the resist layer 11b and a top portion of the Si pillar P1 by using the HfO layers 9aa, 9ba, and 9ca as a mask. The resist layer 11b is then removed.

Figure 1K:
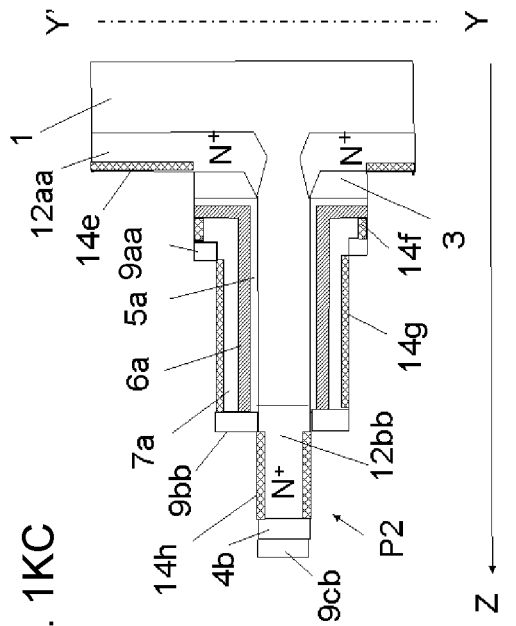
FIGS. 1K(a), 1K(b), and 1K(c) include a plan view and cross-sectional views of the CMOS inverter circuit, the views illustrating the method for manufacturing a semiconductor device having SGTs according to the first embodiment.
Figure 1K:
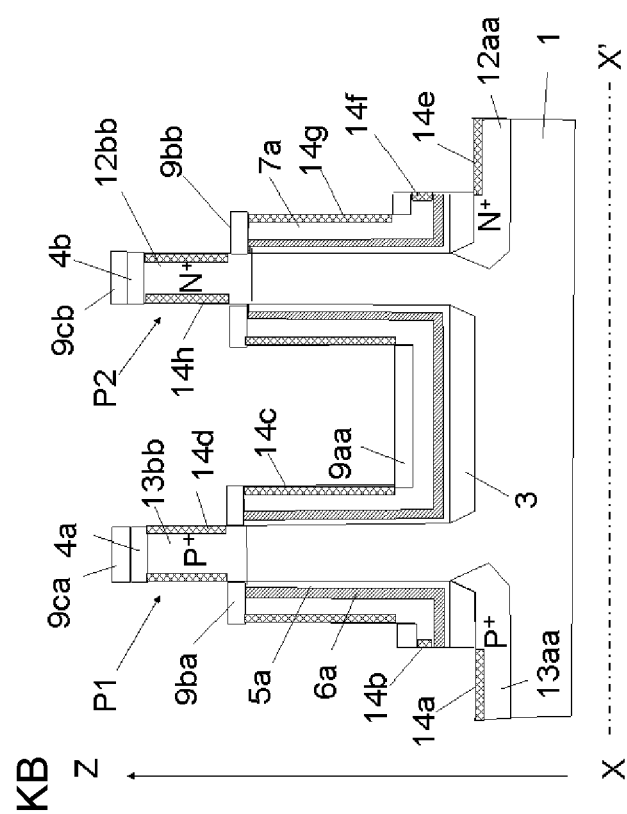
Figure 1K:
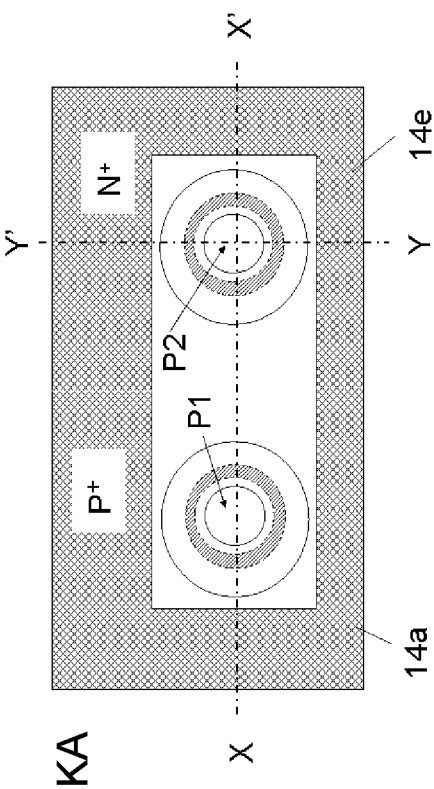

Subsequently, as shown in FIG. 1K, the donor and acceptor impurities contained in the P+ regions 13a and 13b and the N+ regions 12a and 12b are thermally diffused by performing heat treatment. Thus, P+ regions 13aa and 13bb and N+ regions 12aa and 12bb are formed. Subsequently, the Si pillars P1 and P2 and the i-layer substrate 1 are covered with nickel (Ni) by ALD. Furthermore, heat treatment is performed and a remaining Ni film is removed. Thus, Ni silicide layers 14a, 14b, 14c, 14d, 14e, 14f, 14g, and 14h are formed in a surface of the exposed i-layer substrate 1, surfaces of side portions of the exposed poly-Si layer 7a, and surfaces of top portions of the exposed Si pillars P1 and P2.

Figure 1L:
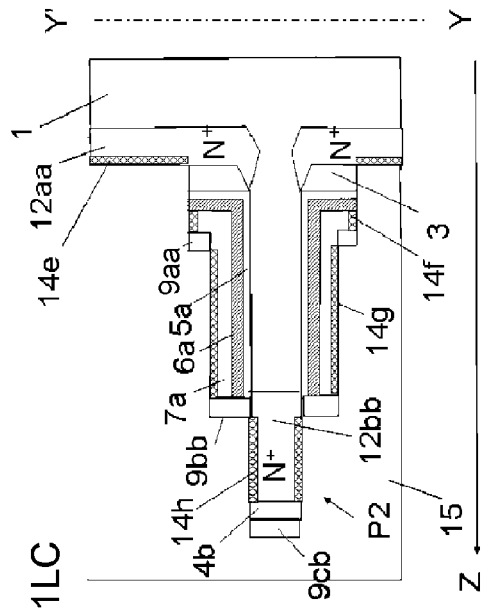
FIGS. 1L(a), 1L(b), and 1L(c) include a plan view and cross-sectional views of the CMOS inverter circuit, the views illustrating the method for manufacturing a semiconductor device having SGTs according to the first embodiment.
Figure 1L:
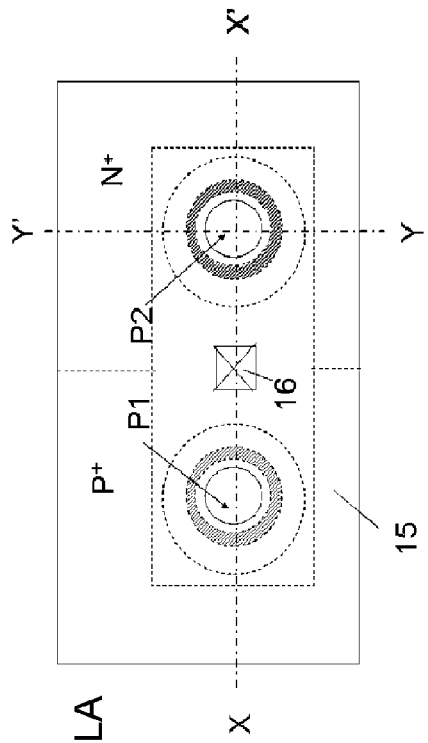
Figure 1L:
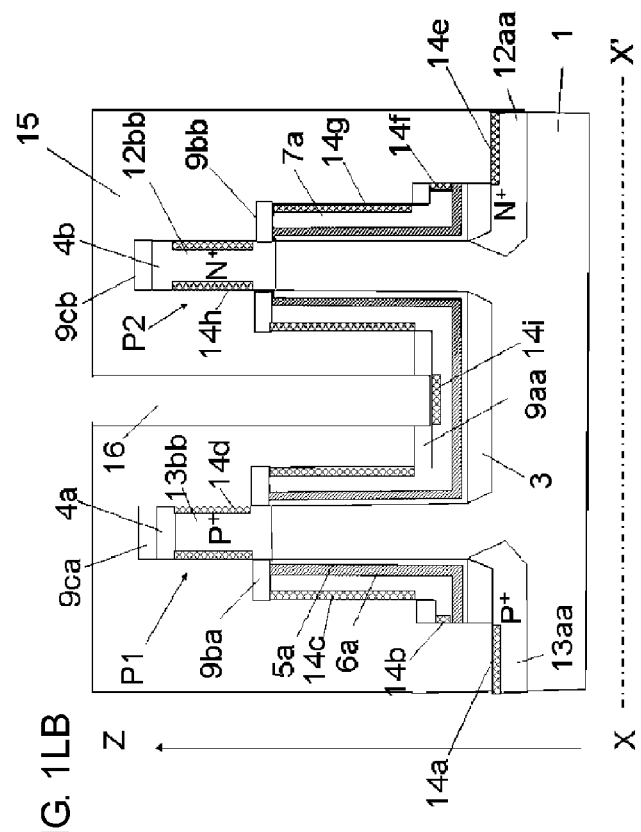

Subsequently, as shown in FIG. 1L, a $SiO_2$ layer 15 is formed by CVD. Subsequently, a resist layer (not shown) is formed on the $SiO_2$ layer 15. A contact hole 16 is formed on the poly-Si layer 7a between the Si pillars P1 and P2 by lithography and RIE of the $SiO_2$ layer 15. The resist layer (not shown) is then removed. A Ni silicide layer 14i is formed in a surface layer portion of the poly-Si layer 7a in the contact hole 16 by the method described with reference to FIG. 1K.

Figure 1M:
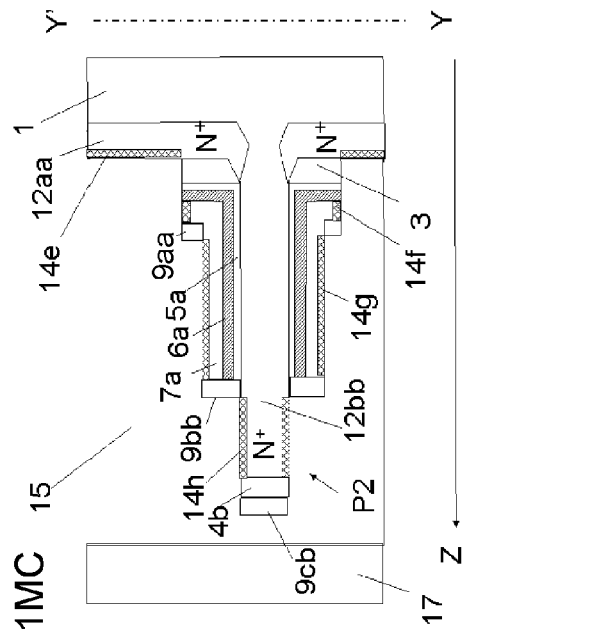
FIGS. 1M(a), 1M(b), and 1M(c) include a plan view and cross-sectional views of the CMOS inverter circuit, the views illustrating the method for manufacturing a semiconductor device having SGTs according to the first embodiment.
Figure 1M:
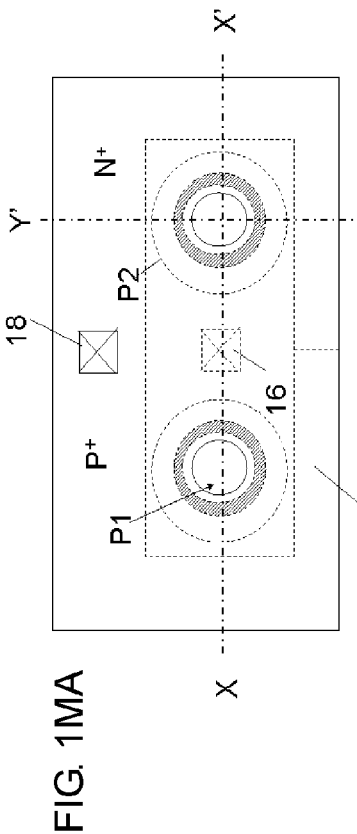
Figure 1M:
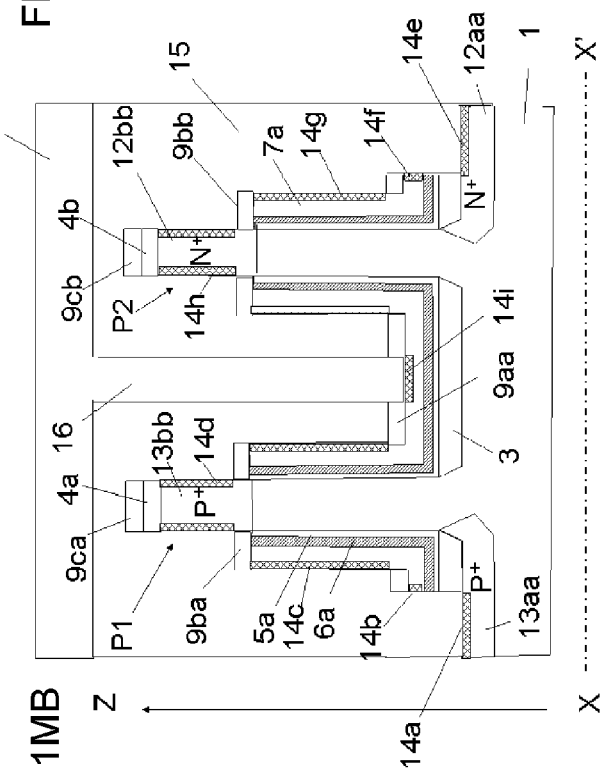

Subsequently, as shown in FIG. 1M, the $SiO_2$ layer 15 is covered with a resist layer 17, and a contact hole 18 is then formed on the Ni silicide layers 14a and 14e that are respectively formed on the P+ region 13aa and the N+ region 12aa of the surface layer portions of the i-layer substrate 1 by lithography and RIE of the $SiO_2$ layer 15.

Figure 1N:
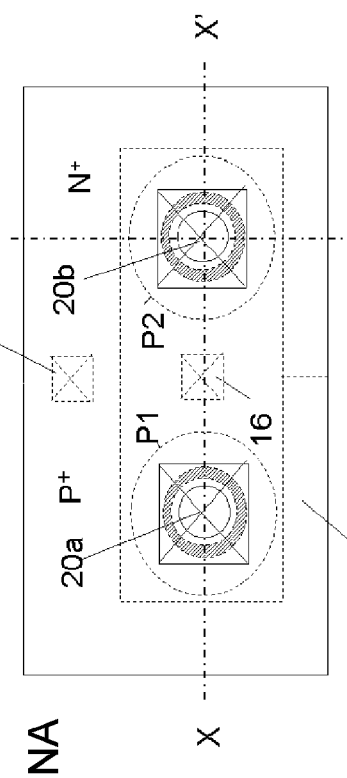
FIGS. 1N(a), 1N(b), and 1N(c) include a plan view and cross-sectional views of the CMOS inverter circuit, the views illustrating the method for manufacturing a semiconductor device having SGTs according to the first embodiment.
Figure 1N:
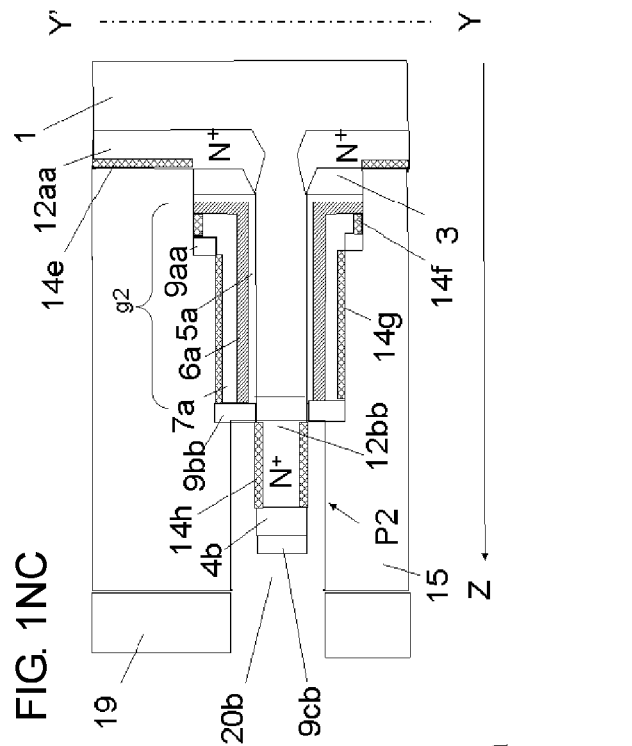
Figure 1N:
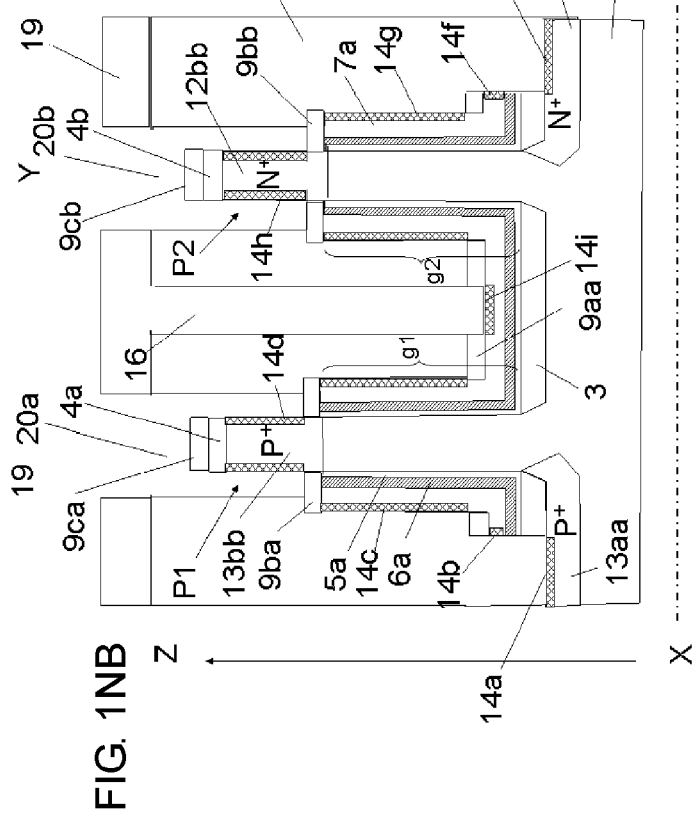

Subsequently, as shown in FIG. 1N, the $SiO_2$ layer 15 is covered with a resist layer 19. Contact holes 20a and 20b are respectively formed, by lithography and RIE of the $SiO_2$ layer 15, on the Si pillars P1 and P2 and on the HfO layers 9ba and 9bb, which are disposed on the upper surfaces of the HfO layer 5a, the TiN layer 6a, the poly-Si layer 7a, and the Ni silicide layers 14c and 14g that are formed on the outer periphery of the Si pillars P1 and P2. Here, as shown in part (b) of FIG. 1N, the HfO layer 5a, the TiN layer 6a, the poly-Si layer 7a, and the Ni silicide layer 14c that are located on an outer peripheral portion of the Si pillar P1, the outer peripheral portion corresponding to an SGT channel of the Si pillar P1, is referred to as a gate layer g1, and the HfO layer 5a, the TiN layer 6a, the poly-Si layer 7a, and the Ni silicide layer 14g that are located on an outer peripheral portion of the Si pillar P2, the outer peripheral portion corresponding to an SGT channel of the Si pillar P2, is referred to as a gate layer g2. In this case, the contact holes 20a and 20b are respectively formed on the HfO layers 9ba and 9bb on the upper surfaces of the gate layers g1 and g2. The HfO layers 9ba and 9bb each function as an etching stopper layer against etching of the $SiO_2$ layer 15. The resist layer 19 is then removed.

Subsequently, as shown in FIG. 1O, a metal layer formed of a multilayer of, for example, titanium (Ti), tantalum (Ta), aluminum (Al), copper (Cu), etc. is formed on the Si pillars P1 and P2, the HfO layers 9ba and 9bb, and the $SiO_2$ layer 15. Subsequently, an input wiring metal layer $V_{in}$, a power supply wiring metal layer $V_{dd}$, a ground wiring metal layer $V_{ss}$, and an output wiring metal layer $V_{out}$ are formed by lithography and etching. The input wiring metal layer $V_{in}$ is connected to the poly-Si layer 7a and the TiN layer 6a that function as a gate of a P-channel SGT through the contact hole 16 and the Ni silicide layer 14i. The power supply wiring metal layer $V_{dd}$ is connected to the P+ region 13bb functioning as a source of the P-channel SGT through the contact hole 20a and the Ni silicide layer 14d. The ground wiring metal layer $V_{ss}$ is connected to the N+ region 12bb functioning as a source of an N-channel SGT through the contact hole 20b and the Ni silicide layer 14h. The output wiring metal layer $V_{out}$ is connected to the P+ region 13aa functioning as a drain of the P-channel SGT and the N+ region 12aa functioning as a drain of the N-channel SGT through the contact hole 18 and the Ni silicide layers 14a and 14e, respectively. Thus, a CMOS inverter circuit having SGTs is formed on the i-layer substrate 1.

According to the first embodiment, the following (1) to (3) are obtained.

(1) The P+ region 13bb and the N+ region 12bb that function as the sources of SGTs, the P+ region 13bb and the N+ region 12bb being respectively disposed in top portions of the Si pillars P1 and P2, are respectively connected to the power supply wiring metal layer $V_{dd}$ and the ground wiring metal layer $V_{ss}$ through the entire surfaces of the Ni silicide layers 14d and 14h that have low resistances, that are respectively in contact with the P+ region 13bb and the N+ region 12bb, and that are respectively formed on the outer peripheral side faces of the Si pillars P1 and P2. Furthermore, the power supply wiring metal layer $V_{dd}$ and the ground wiring metal layer $V_{ss}$ are respectively electrically connected to the P+ region 13bb and the N+ region 12bb which function as the sources of SGTs in the vicinity of the boundaries with channels. Accordingly, SGTs are formed in which the resistances of sources (which may also function as drains in other circuits) formed in top portions of the Si pillars P1 and P2 are suppressed to low. As a result, high-speed driving of the circuit is realized.

(2) The P+ region 13b and the N+ region 12b which function as the sources of SGTs are formed by a self-alignment by ion implantation using, as a mask, the TiN layer 6a and the poly-Si layer 7a which function as gate conductor layers. The P+ region 13b and the N+ region 12b are further subject to heat treatment and become the P+ region 13bb and the N+ region 12bb. The P+ region 13bb is formed so that a boundary position between the P+ region 13bb functioning as the source of an SGT and a channel region of the SGT is aligned with a position of an upper end of the TiN layer 6a and the poly-Si layer 7a which function as gate conductor layers. Similarly, the N+ region 12bb is formed so that a boundary position between the N+ region 12bb functioning as the source of an SGT and a channel region of the SGT is aligned with a position of an upper end of the TiN layer 6a and the poly-Si layer 7a which function as gate conductor layers. The Ni silicide layers 14d and 14h are respectively formed by a self-alignment on side faces of the P+ region 13bb and N+ region 12bb which function as the sources, the side faces being exposed by using the HfO layers 9ba and 9bb as a mask. Accordingly, the relationship of a lower end position at which the power supply wiring metal layer $V_{dd}$ in a bottom portion of the contact hole 20a is connected to the P+ region 13bb functioning as a source; a lower end position at which the ground wiring metal layer $V_{ss}$ in a bottom portion of the contact hole 20b is connected to the N+ region 12bb functioning as a source; lower end positions of the Ni silicide layers 14d and 14h; and boundary positions between a channel and the P+ region 13bb functioning as a source and between a channel and the N+ region 12bb functioning as a source are determined by a self-alignment with the HfO layers 9ba and 9bb therebetween, the HfO layers 9ba and 9bb being respectively disposed on the gate layers g1 and g2. With this structure, it is possible to form SGTs each having a resistance of a source (which may also function as a drain in other circuits) with small variations and having a low coupling capacitance between a low-resistance source and a gate conductor layer.

(3) The contact hole 20a is formed on the HfO layer 9ba formed on an upper end of the gate layer g1 including the TiN layer 6a, the poly-Si layer 7a, and the Ni silicide layer 14c that are formed on the outer periphery of the Si pillar P1. Similarly, the contact hole 20b is formed on the HfO layer 9bb formed on an upper end of the gate layer g2 including the TiN layer 6a, the poly-Si layer 7a, and the Ni silicide layer 14g that are formed on the outer periphery of the Si pillar P2. The HfO layers 9ba and 9bb each function as an etching stopper layer against etching of the $SiO_2$ layer 15. Accordingly, the step of etching the $SiO_2$ layer 15 for forming the contact holes 20a and 20b can be performed with a good controllability.

The contact holes 20a and 20b on the HfO layers 9ba and 9bb are formed by etching the $SiO_2$ layer 15 using the resist layer 19 as an etching mask by RIE in which, for example, a mixed gas of carbon fluoride ($CF_4$) and hydrogen ($H_2$) is used as an etching gas. In this case, the etching rate of the $SiO_2$ layer 15 is higher than the etching rates of the HfO layers 9ba and 9bb and the Ni silicide layers 14d and 14h. Thus, the contact holes 20a and 20b can be respectively formed on the HfO layers 9ba and 9bb in a state where the Ni silicide layers 14d and 14h are left. In the RIE, the HfO layers 9ca and 9cb provided on top portions of the Si pillars P1 and P2 function as an etching mask to the Ni silicide layers 14d and 14h. Accordingly, the contact holes 20a and 20b can be respectively formed on the HfO layers 9ba and 9bb in a state where the Ni silicide layers 14d and 14h are left only under a condition that the etching rate of the HfO layers 9ba and 9bb is sufficiently lower than the etching rate of the $SiO_2$ layer 15. This means that in the case where the $SiO_2$ layer 15 is used as an insulating layer in which contact holes are formed and the HfO layers 9ba and 9bb function as a contact-hole etching stopper layer, the combination of the $SiO_2$ layer 15 and the HfO layers 9ba and 9bb is not limited to $SiO_2$ and HfO and any combination of layers composed of other materials may be used as long as the etching rate of the insulating layer in which contact holes are formed is higher than the etching rate of the contact-hole etching stopper layer.

In addition, it is necessary that an insulating property of the contact-hole etching stopper layer be ensured so that electrical short-circuit does not occur between the power supply wiring metal layer $V_{dd}$ and the TiN layer 6a and poly-Si layer 7a which function as a gate of an SGT and between the ground wiring metal layer $V_{ss}$ and the TiN layer 6a and poly-Si layer 7a which function as a gate of an SGT. Therefore, the whole of the contact-hole etching stopper layer need not be formed of an insulating layer as in the HfO layers 9ba and 9bb used as the contact-hole etching stopper layer in this embodiment. For example, a layer obtained by forming a silicon (Si) layer by an ALD method on each of the HfO layers 9ba and 9bb may be used as the contact-hole etching stopper layer. In the case where the $SiO_2$ layer 15 is etched by RIE using a mixed gas of carbon fluoride ($CF_4$) and hydrogen ($H_2$) as an etching gas, the etching rate of Si relative to $SiO_2$ can be reduced to a considerable degree by increasing the proportion of hydrogen (refer to, for example, Makoto Sekine, "Background and Challenges for Plasma Etching Tool development", J. Plasma Fusion res. Vol. 83, No. 4, pp. 319-324 (2007)). Thus, a material having a higher insulating property than HfO (hafnium oxide) can be used as the contact-hole etching stopper layer, and the contact holes 20a and 20b in which an occurrence of electrical short-circuit is reliably prevented can be formed.

Second Embodiment

FIGS. 2A to 2E show a method for manufacturing a CMOS inverter circuit having SGTs according to a second embodiment of the present invention.

Figure 2A:
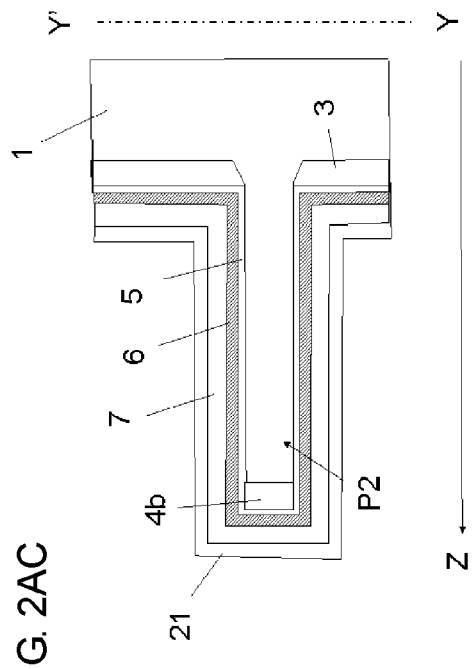
FIG. 2A(a) is a plan view and FIGS. 2A(b) and 2A(c) are cross-sectional views of a CMOS inverter circuit, the views illustrating a method for manufacturing a semiconductor device having SGTs according to a second embodiment.
Figure 2A:
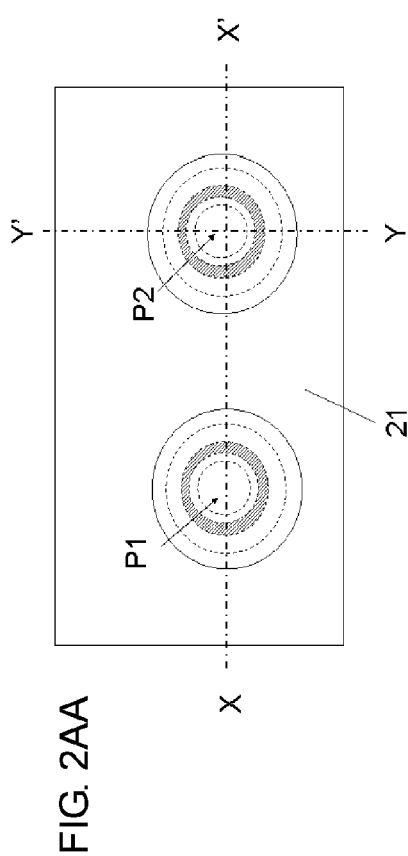
Figure 2A:
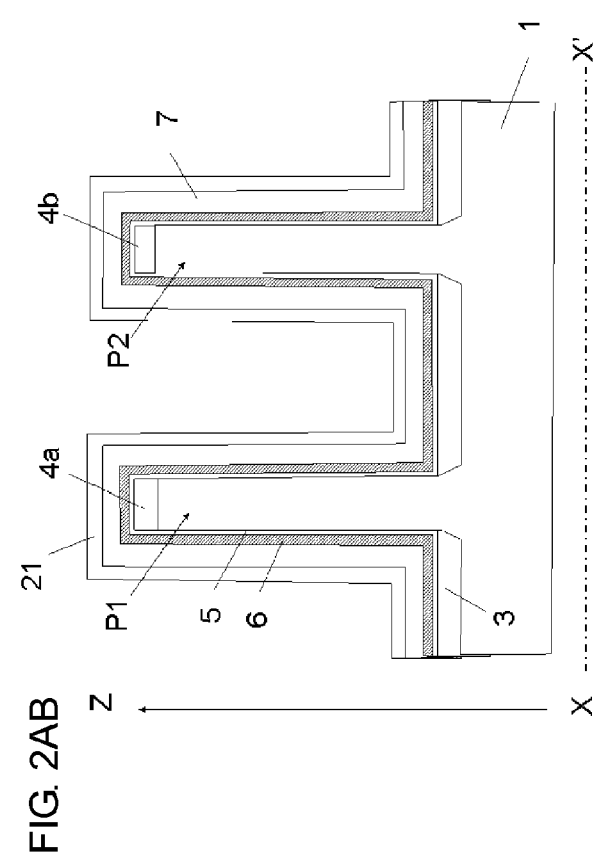

First, as shown in FIG. 2A, Si pillars P1 and P2 are formed on an i-layer substrate 1. Subsequently, $SiO_2$ layers 3, 4a, and 4b are respectively formed on the i-layer substrate 1, the Si pillar P1, and the Si pillar P2. Subsequently, a HfO layer 5, a TiN layer 6, and a poly-Si layer 7 are formed so as to cover the whole of the Si pillars P1 and P2 and the $SiO_2$ layer 3. (These steps are the same as the steps shown in FIGS. 1A to 1C in the first embodiment.) Subsequently, a HfO layer 21 is formed by an ALD method so as to cover the whole.

Figure 2B:
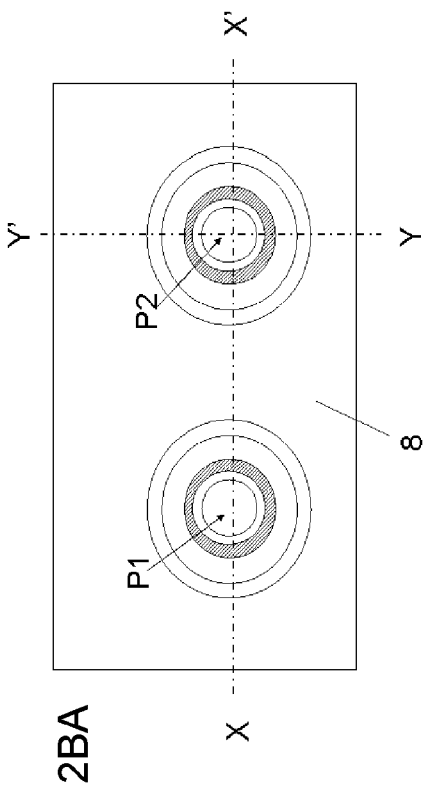
FIGS. 2B(a), 2B(b), and 2B(c) are a plan view and cross-sectional views of the CMOS inverter circuit, the views illustrating the method for manufacturing a semiconductor device having SGTs according to the second embodiment.
Figure 2B:
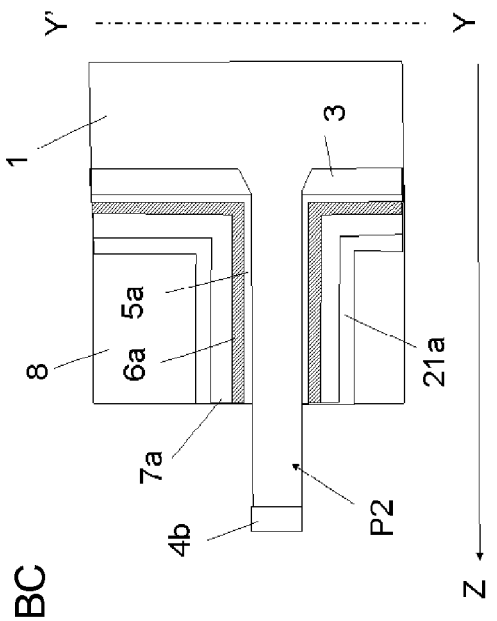
Figure 2B:

Subsequently, as shown in FIG. 2B, a resist (not shown) is applied so as to cover the whole of the i-layer substrate 1 and the Si pillars P1 and P2. Subsequently, a surface layer portion of the resist is uniformly etched by an etch-back process, thus forming a resist layer 8 whose surface is located at a particular position in a height direction (Z-direction) of the Si pillars P1 and P2. Subsequently, the HfO layer 21, the poly-Si layer 7, the TiN layer 6, and the HfO layer 5 located on upper portions of the Si pillars P1 and P2 are removed by etching using the resist layer 8 as an etching mask to leave a HfO layer 21a, a poly-Si layer 7a, a TiN layer 6a, and a HfO layer 5a on side faces of the Si pillars P1 and P2. In this step, the $SiO_2$ layers 4a and 4b are left on top portions of the Si pillars P1 and P2, respectively. The resist layer 8 is then removed. (This step is the same as the step shown in FIG. 1D in the first embodiment except that the exposed HfO layer 21 is removed by etching.)

Figure 2C:
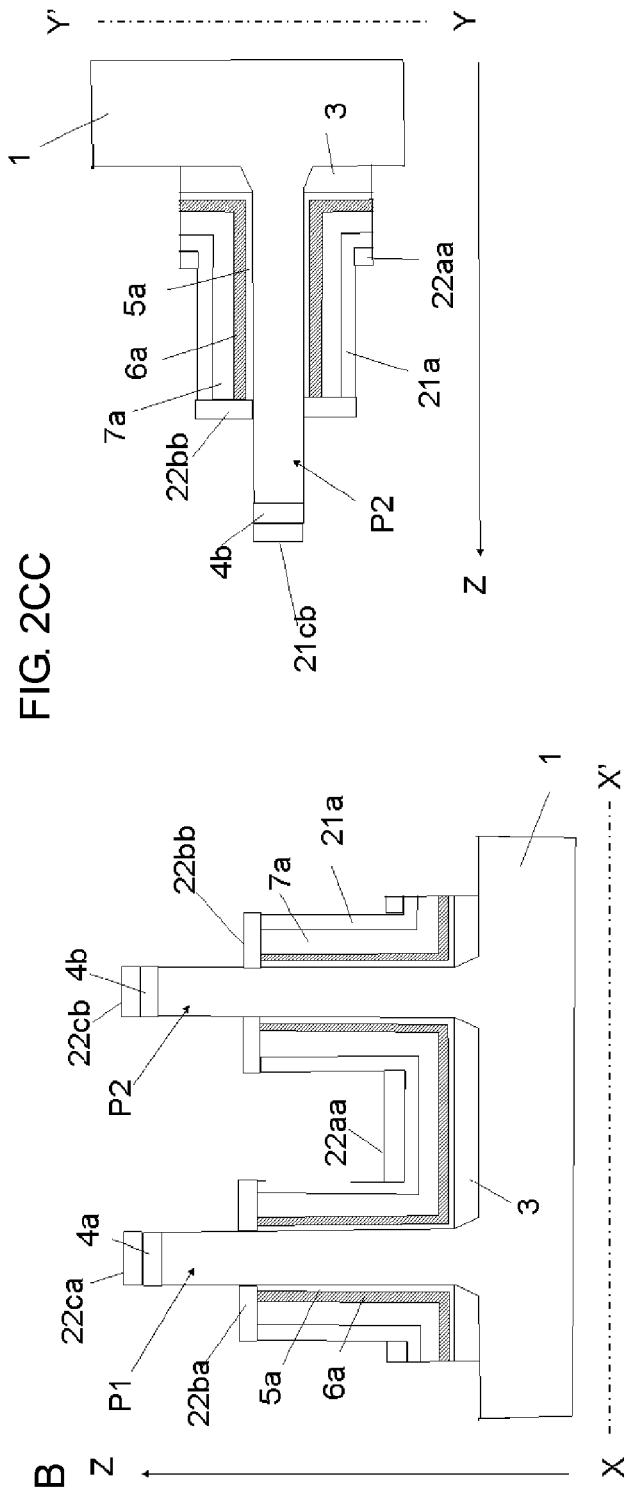
FIGS. 2C(a), 2C(b), and 2C(c) are a plan view and cross-sectional views of the CMOS inverter circuit, the views illustrating the method for manufacturing a semiconductor device having SGTs according to the second embodiment.

Subsequently, as shown in FIG. 2C, the HfO layer 21a is covered with HfO by using CVD so that the whole of the i-layer substrate 1 and the Si pillars P1 and P2 are covered with HfO. Subsequently, the HfO layer 21a on the side faces of the Si pillars P1 and P2 is removed by plasma etching. Thus, HfO layers 22aa, 22ba, 22bb, 22ca, and 22cb are respectively formed on the HfO layer 21a on the i-layer substrate 1, upper end surfaces of the HfO layer 21a, the poly-Si layer 7a, the TiN layer 6a, and the HfO layer 5a that surround the Si pillars P1 and P2, and flat portions above the Si pillars P1 and P2. (These steps are the same as the steps shown in FIGS. 1E and 1F in the first embodiment.)

Figure 2D:
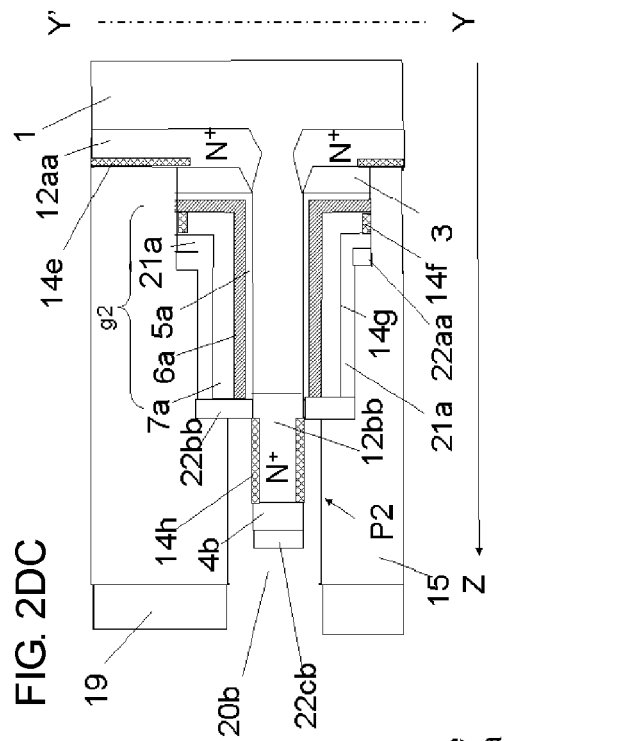
FIGS. 2D(a), 2D(b), and 2D(c) are a plan view and cross-sectional views of the CMOS inverter circuit, the views illustrating the method for manufacturing a semiconductor device having SGTs according to the second embodiment.
Figure 2D:
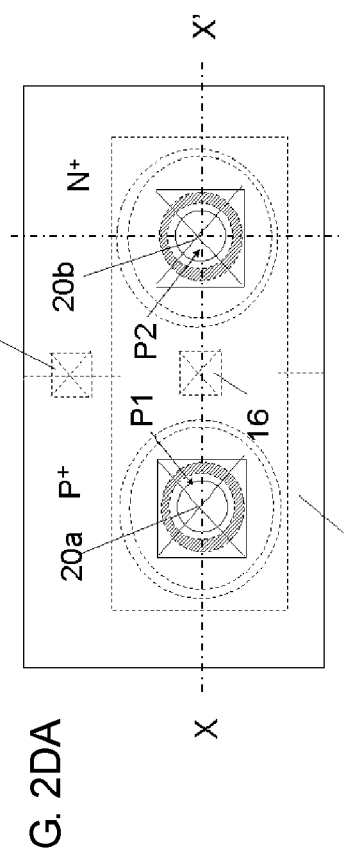
Figure 2D:
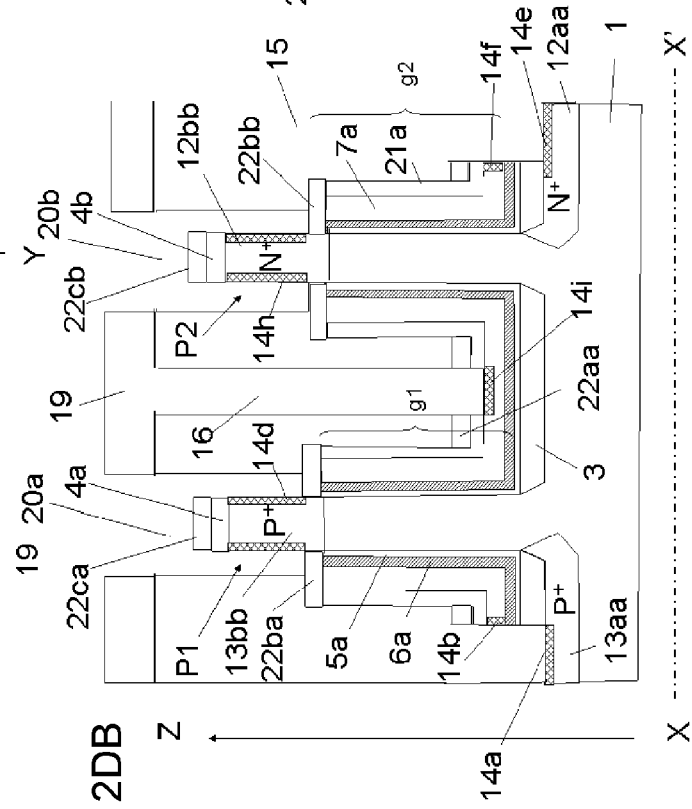

Subsequently, steps the same as those shown in FIGS. 1G to 1N in the first embodiment are performed. Consequently, as shown in FIG. 2D, a $SiO_2$ layer 15 is etched by using a resist layer 19 as an etching mask for RIE to respectively form contact holes 20a and 20b on the HfO layers 22ba and 22bb. The HfO layers 22ba and 22bb are respectively disposed on gate layers g1 and g2 including the HfO layer 21a, the poly-Si layer 7a, the TiN layer 6a, and the HfO layer 5a that are formed on outer peripheral portions of the Si pillars P1 and P2, the outer peripheral portions corresponding to SGT channels. In this case, unlike the first embodiment, the HfO layer 21a, which is an insulating layer, is left on the outermost peripheries of the gate layers g1 and g2.

Figure 2E:
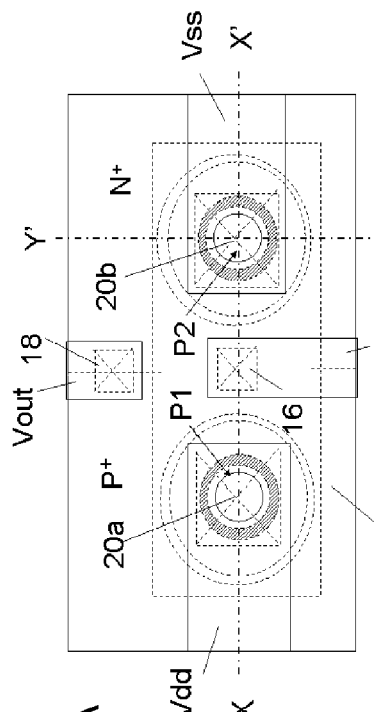
FIGS. 2E(a), 2E(b), and 2E(c) are a plan view and cross-sectional views of the CMOS inverter circuit, the views illustrating the method for manufacturing a semiconductor device having SGTs according to the second embodiment.
Figure 2E:
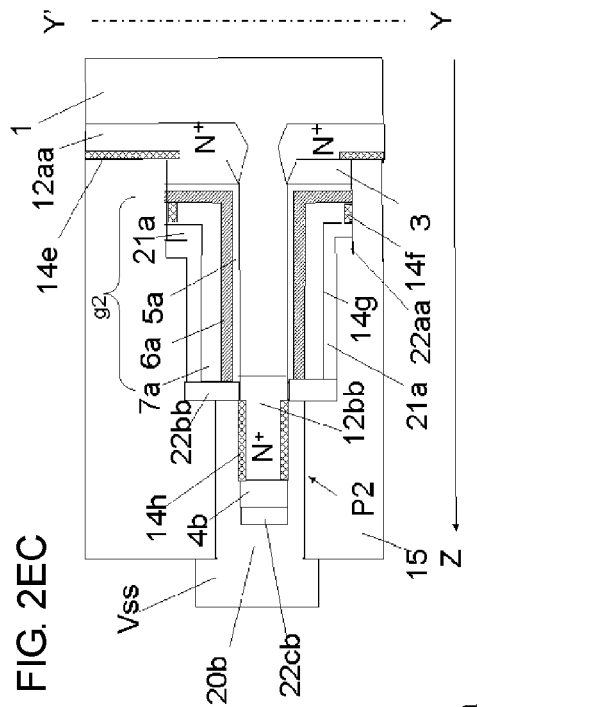
Figure 2E:
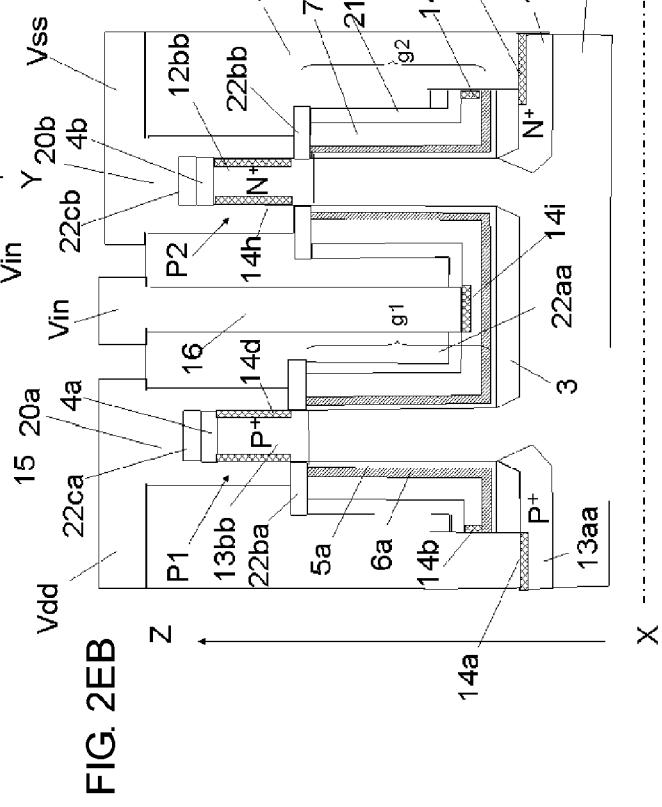

Subsequently, as shown in FIG. 2E, a power supply wiring metal layer $V_{dd}$, an input wiring metal layer $V_{in}$, an output wiring metal layer $V_{out}$, and a ground wiring metal layer $V_{ss}$ are formed as in the step shown in FIG. 1O in the first embodiment. Thus, a CMOS inverter circuit having SGTs, the circuit having a function similar to that of the CMOS inverter circuit having SGTs according to the first embodiment, is formed on the i-layer substrate 1.

According to the second embodiment, the HfO layer 21a, which is an insulating layer, is formed on the outermost peripheries of the gate layers g1 and g2. With this structure, even if bottom portions of the contact holes 20a and 20b are located outside the HfO layers 22ba and 22bb, respectively, due to a mask misalignment in the step of lithography for forming the contact holes 20a and 20b, electrical short-circuit between the power supply wiring metal layer $V_{dd}$ and the poly-Si layer 7a and between the ground wiring metal layer $V_{ss}$ and the poly-Si layer 7a can be prevented by the presence of the HfO layer 21a.

Third Embodiment

FIGS. 3A to 3E and FIGS. 4A and 4B show methods for manufacturing a CMOS inverter circuit having SGTs according to a third embodiment of the present invention.

Figure 3A:
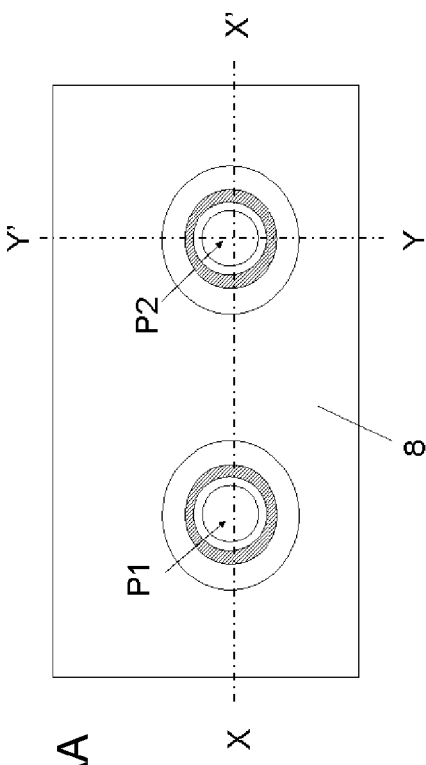
FIG. 3A(a) is a plan view and FIGS. 3A(b) and 3A(c) are cross-sectional views of a CMOS inverter circuit, the views illustrating a method for manufacturing a semiconductor device having SGTs according to a third embodiment.
Figure 3A:
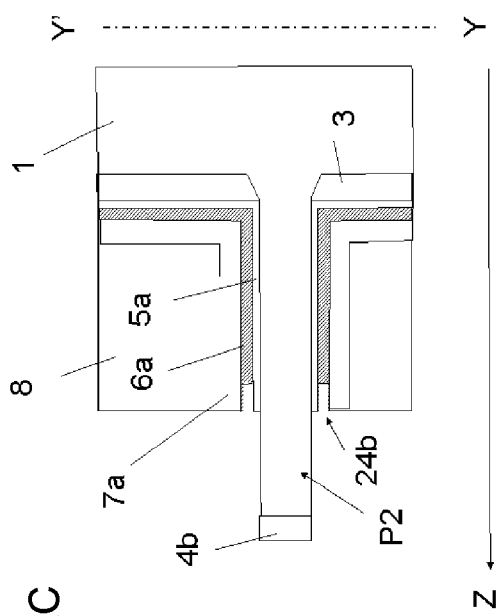
Figure 3A:
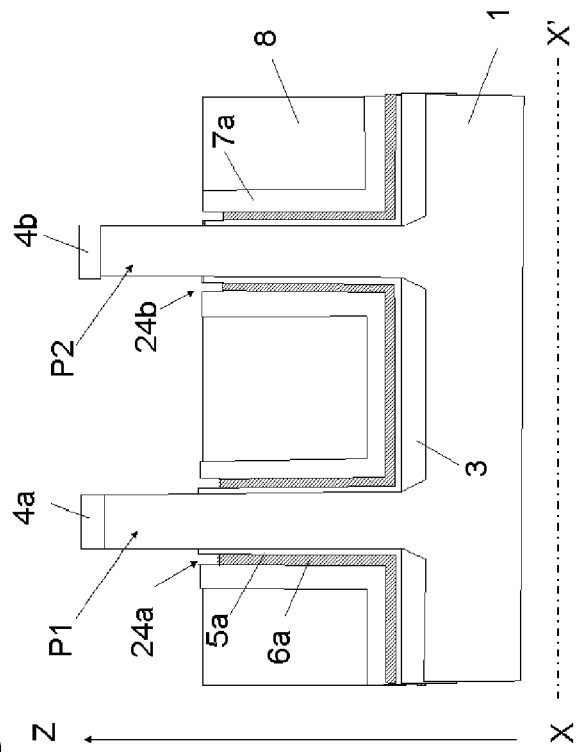

First, as shown in FIG. 3A, Si pillars P1 and P2 are formed on an i-layer substrate 1. Subsequently, $SiO_2$ layers 3, 4a, and 4b are formed on the i-layer substrate 1 and the Si pillars P1 and P2, respectively. Subsequently, a HfO layer 5, a TiN layer 6, and a poly-Si layer 7 are formed so as to cover the whole of the Si pillars P1 and P2 and the $SiO_2$ layer 3. Subsequently, a resist (not shown) is applied so as to cover the whole of the i-layer substrate 1 and the Si pillars P1 and P2. Subsequently, a surface layer portion of the resist is uniformly etched by an etch-back process. Thus, a resist layer 8 whose surface is located at a particular position in a height direction (Z-direction) of the Si pillars P1 and P2 is formed. Subsequently, the poly-Si layer 7, the TiN layer 6, and the HfO layer 5 located on upper portions of the Si pillars P1 and P2 are removed by etching using the resist layer 8 as an etching mask to leave a poly-Si layer 7a, a TiN layer 6a, and a HfO layer 5a on side faces of the Si pillars P1 and P2. In this step, the $SiO_2$ layers 4a and 4b are left on top portions of the Si pillars P1 and P2, respectively. (These steps are the same as the steps shown in FIGS. 1A to 1D in the first embodiment.) Subsequently, as shown in FIG. 3A, upper end portions 24a and 24b of the TiN layer 6a are removed by etching using the poly-Si layer 7a as an etching mask. The resist layer 8 is then removed.

Next, as shown in FIG. 3B, a HfO layer 23 is formed by ALD so as to cover the whole of the Si pillars P1 and P2 and the upper surface of the i-layer substrate 1. Consequently, the upper end portions 24a and 24b of the TiN layer 6a are filled with the HfO layer 23.

Figure 3C:
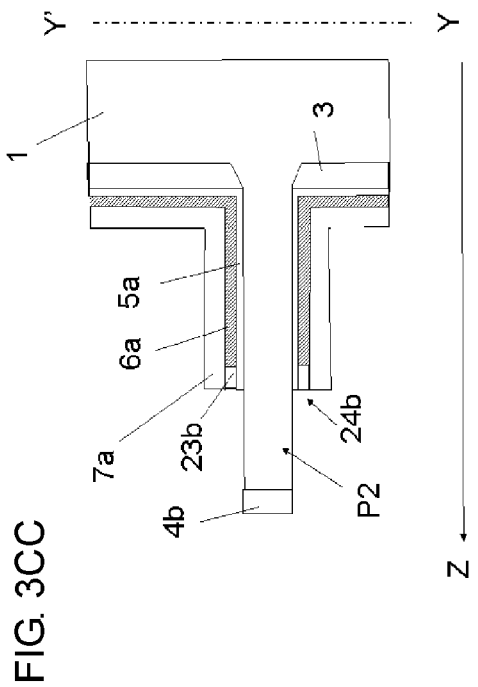
FIGS. 3C(a), 3C(b), and 3C(c) are a plan view and cross-sectional views of the CMOS inverter circuit, the views illustrating the method for manufacturing a semiconductor device having SGTs according to the third embodiment.
Figure 3C:
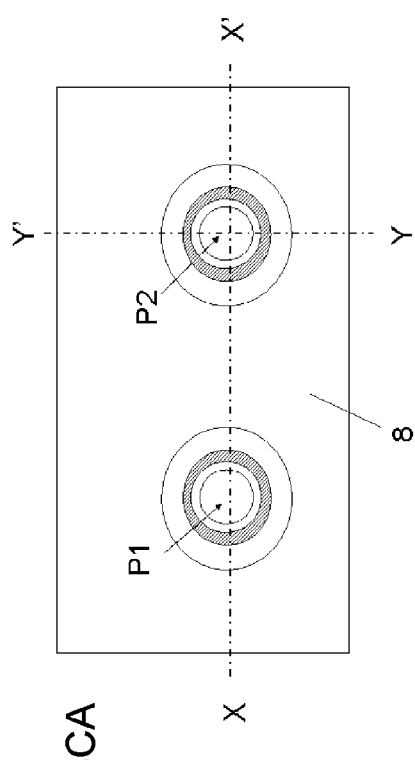
Figure 3C:
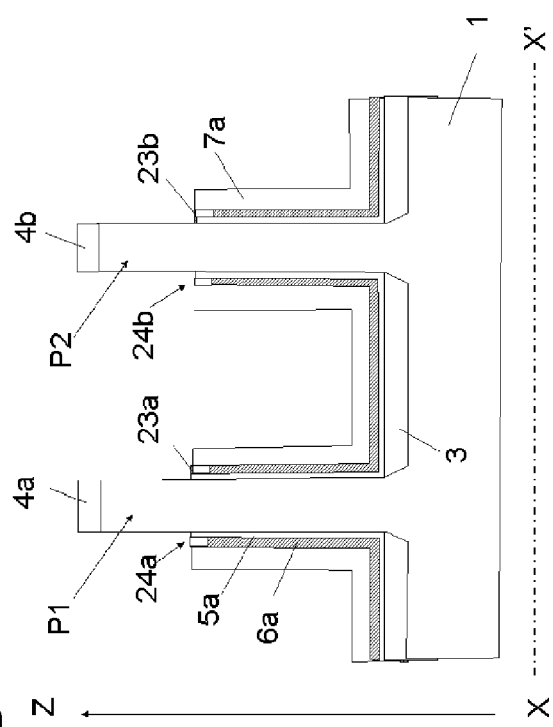

Subsequently, as shown in FIG. 3C, the HfO layer 23 disposed on the side faces of the Si pillars P1 and P2 and on the poly-Si layer 7a is removed by isotropic plasma etching to leave HfO layers 23a and 23b on the upper end portions 24a and 24b of the TiN layer 6a, respectively.

Figure 3D:
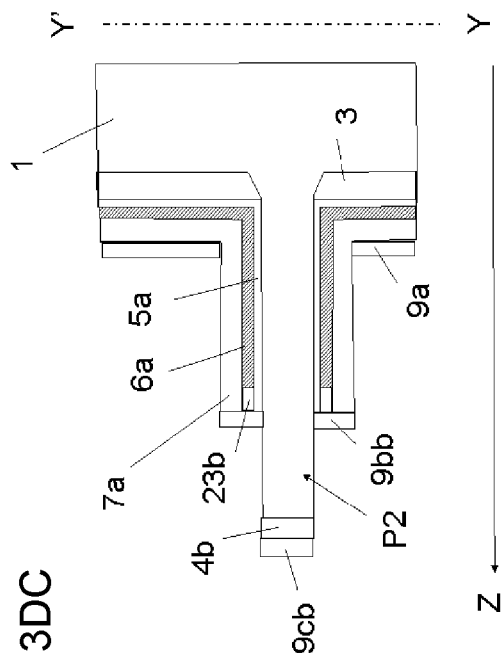
FIGS. 3D(a), 3D(b), and 3D(c) are a plan view and cross-sectional views of the CMOS inverter circuit, the views illustrating the method for manufacturing a semiconductor device having SGTs according to the third embodiment.
Figure 3D:
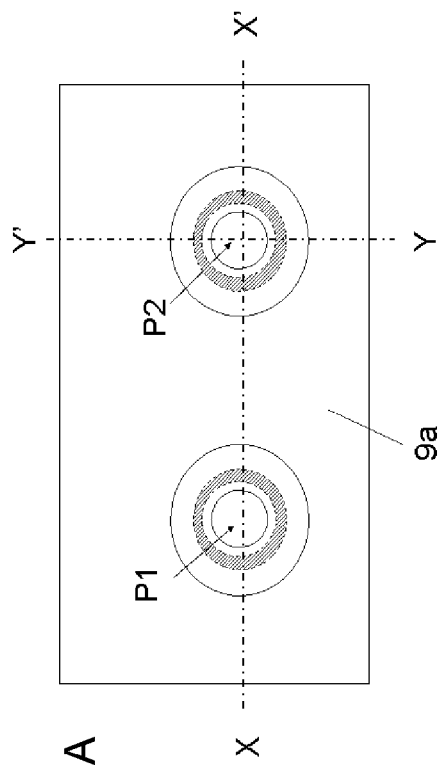
Figure 3D:
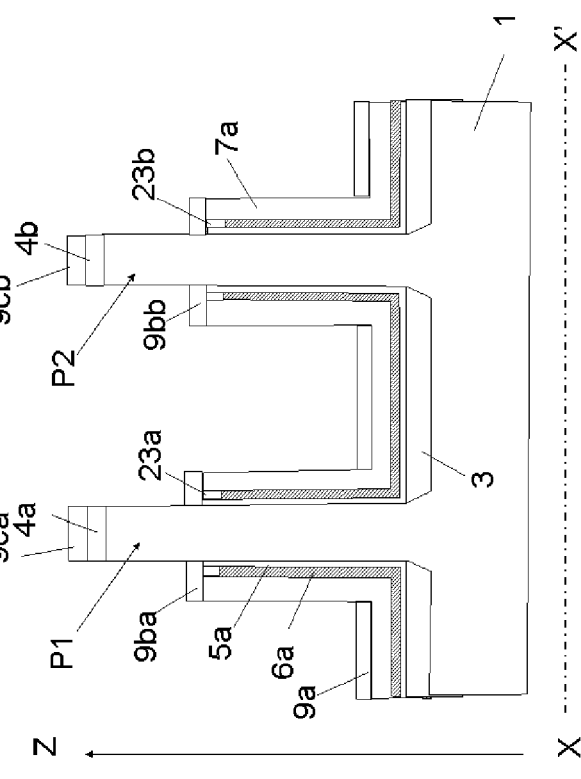

Subsequently, as shown in FIG. 3D, a HfO layer 9a is formed on a bottom portion of the poly-Si layer 7a as in the step shown in FIGS. 1E and 1F in the first embodiment. In addition, a HfO layer 9ba is formed on upper end surfaces of the HfO layer 5a, the HfO layer 23a on the upper end portion of the TiN layer 6a, and the poly-Si layer 7a. Similarly, a HfO layer 9bb is formed on upper end surfaces of the HfO layer 5a, the HfO layer 23b on the upper end portion of the TiN layer 6a, and the poly-Si layer 7a. Furthermore, HfO layers 9ca and 9cb are formed on the $SiO_2$ layers 4a and 4b, respectively.

Figure 3E:
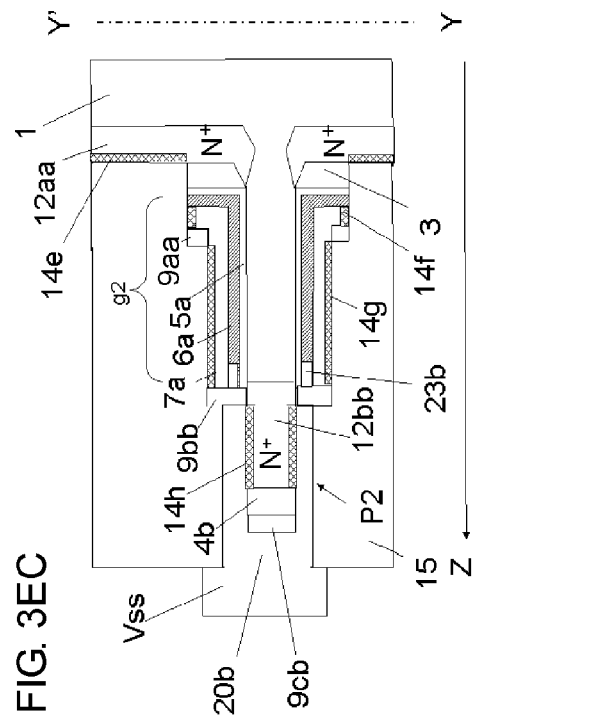
FIGS. 3E(a), 3E(b), and 3E(c) are a plan view and cross-sectional views of the CMOS inverter circuit, the views illustrating the method for manufacturing a semiconductor device having SGTs according to the third embodiment.
Figure 3E:
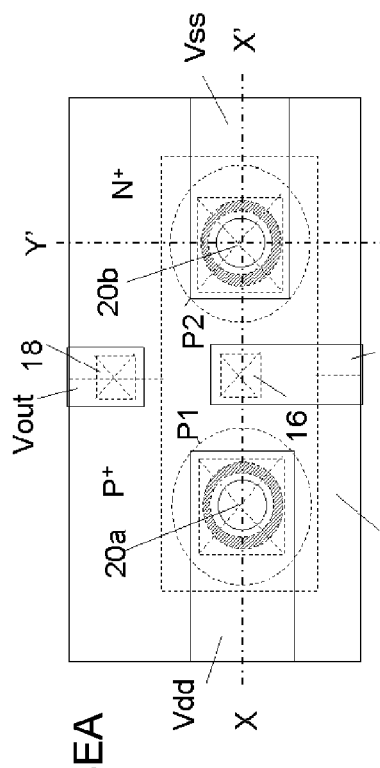
Figure 3E:
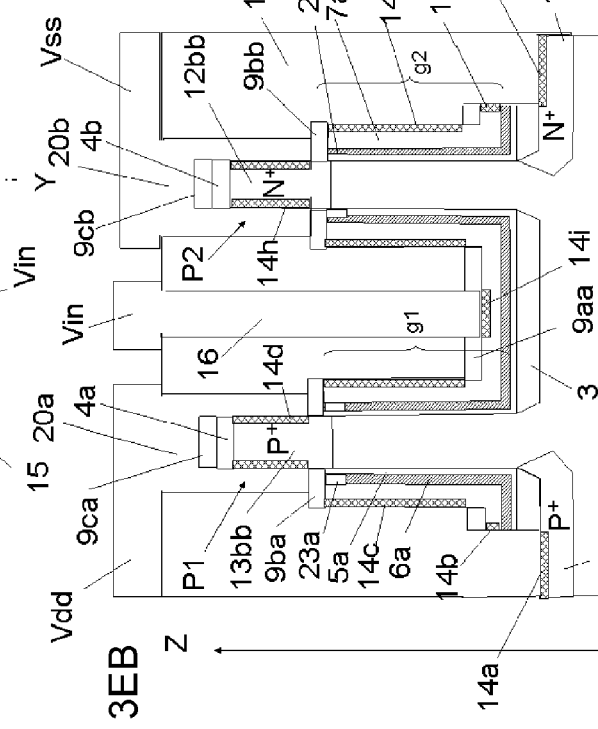

Subsequently, as shown in FIG. 3E, contact holes 20a and 20b are formed in a $SiO_2$ layer 15 on the HfO layers 9ba and 9bb that are respectively disposed on gate layers g1 and g2 as in the steps shown in FIGS. 1G to 1O in the first embodiment. The gate layer g1 includes a Ni silicide layer 14c, the poly-Si layer 7a, the TiN layer 6a, and the HfO layer 5a that are formed on an outer peripheral portion of the Si pillar P1, the outer peripheral portion corresponding to an SGT channel. Similarly, the gate layer g2 includes a Ni silicide layer 14g, the poly-Si layer 7a, the TiN layer 6a, and the HfO layer 5a that are formed on an outer peripheral portion of the Si pillar P2, the outer peripheral portion corresponding to an SGT channel. Furthermore, a power supply wiring metal layer $V_{dd}$, an input wiring metal layer $V_{in}$, an output wiring metal layer $V_{out}$, and a ground wiring metal layer $V_{ss}$ are formed. Thus, a CMOS inverter circuit having SGTs, the circuit having a function similar to that of the CMOS inverter circuit having SGTs according to the first embodiment, is formed on the i-layer substrate 1.

According to the third embodiment, the following (1) and (2) are obtained.

(1) In the first embodiment, heat treatment is performed for the $N^+$ regions 12a and 12b and the $P^+$ regions 13a and 13b that are formed in lower portions and upper portions of the Si pillars P2 and P1 shown in FIG. 1J. Consequently, as shown in FIG. 1K, donor and acceptor impurities are thermally diffused to form the $N^+$ regions 12aa and 12bb and the $P^+$ regions 13aa and 13bb. In this case, the positions of the lower ends of the $P^+$ region 13bb and the $N^+$ region 12bb that are respectively disposed in top portions of the Si pillars P1 and P2 are preferably located at the same height as the upper ends of the TiN layer 6a functioning as SGT gates. In the first embodiment, this height position is determined by adjusting the thickness of the HfO layers 9ba and 9bb and the heat treatment time of impurity diffusion. In contrast, in the third embodiment, the lower ends of the $P^+$ region 13bb and the $N^+$ region 12bb that are respectively disposed in top portions of the Si pillars P1 and P2 are located at the same height as the upper ends of the TiN layer 6a functioning as SGT gates by further adjusting the etching depth of the upper end portions 24a and 24b of the TiN layer 6a in addition to the adjustment of the thickness of the HfO layers 9ba and 9bb and the heat treatment time of impurity diffusion in the first embodiment. Accordingly, the height position can be more easily determined.

(2) As shown in FIG. 3E, in addition to the HfO layers 9ba and 9bb, the HfO layers 23a and 23b disposed in the upper end portions 24a and 24b of the TiN layer 6a are respectively interposed between the TiN layer 6a and the power supply wiring metal layer $V_{dd}$ and between the TiN layer 6a and the ground wiring metal layer $V_{ss}$. Accordingly, the occurrence of electrical short-circuit between the TiN layer 6a and the power supply wiring metal layer $V_{dd}$ and between the TiN layer 6a and the ground wiring metal layer $V_{ss}$ is more effectively prevented compared with the first embodiment.

In FIG. 3B, since the HfO layer 23 is formed by ALD, the HfO layer 23 formed on the side faces of the Si pillars P1 and P2 and the HfO layer 23 formed above the i-layer substrate 1 each have the same thickness Lh. This thickness Lh (μm) of the HfO layer 23 preferably satisfies the following relationship:

$$Lh > (1/2) \times Lt \qquad (a)$$

where Lt represents a thickness (μm) of the TiN layer 6a. In this case, as shown in FIG. 3C, the upper end portions 24a and 24b of the TiN layer 6a are uniformly filled with the HfO layers 23a and 23b, respectively.

Alternatively, as shown in FIG. 4A, upper end portions of a TiN layer 6a and a poly-Si layer 7a that are disposed between a HfO layer 5a and a HfO layer 21a formed on outer peripheries of Si pillars P1 and P2 may be etched so as to have a predetermined depth. Subsequently, HfO layers 25a and 25b may be embedded in the upper end portions of the etched TiN layer 6a and poly-Si layer 7a by the method shown in FIGS. 3B and 3C. Subsequently, HfO layers 22ba and 22bb may be formed on the embedded HfO layers 25a and 25b, respectively. This method also provides an effect the same as the above-described effect of the third embodiment.

Figure 4B:
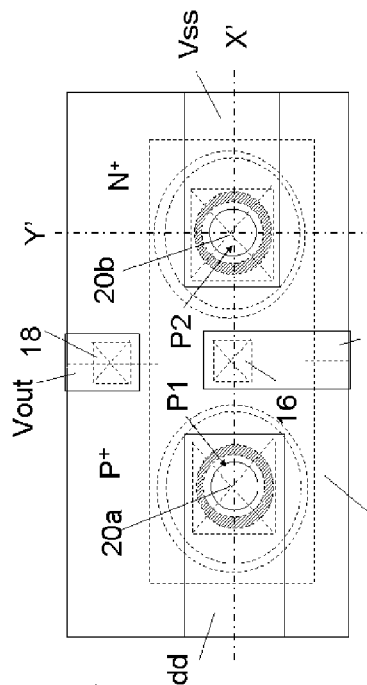
FIGS. 4B(a), 4B(b), and 4B(c) are a plan view and cross-sectional views of the CMOS inverter circuit, the views illustrating the method for manufacturing a semiconductor device having SGTs according to the third embodiment.
Figure 4B:
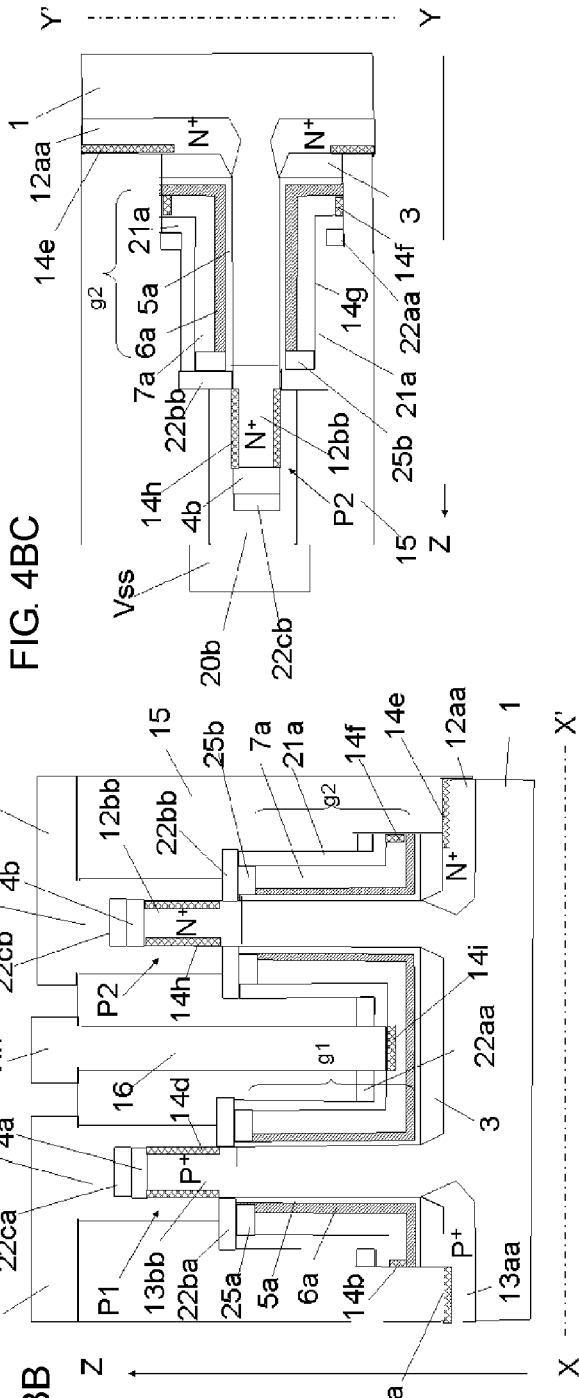
Figure 4B:
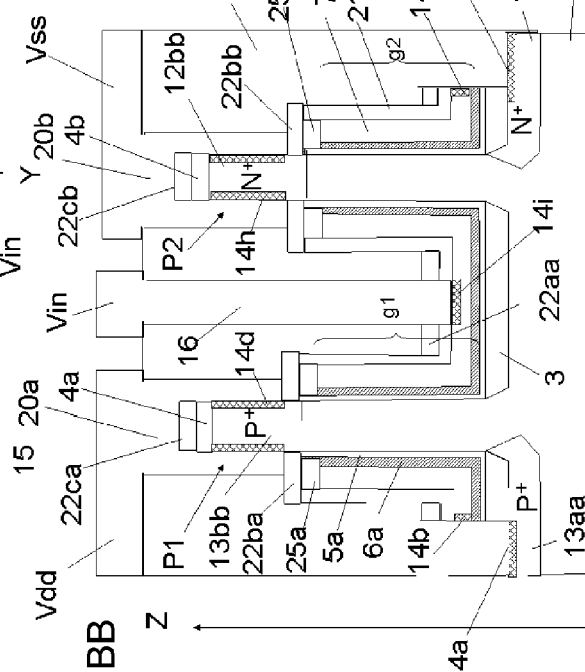

Subsequently, the steps shown in FIGS. 2D and 2E of the second embodiment are performed. Thus, a CMOS inverter circuit having SGTs is formed as shown in FIG. 4B. In this structure, two insulating layers, namely, the embedded HfO layer 25a and the HfO layer 22ba formed on the HfO layer 25a are provided between the power supply wiring metal layer $V_{dd}$ and the TiN layer 6a and poly-Si layer 7a that function as a gate conductor layer of an SGT. Similarly, two insulating layers, namely, the embedded HfO layer 25b and the HfO layer 22bb formed on the HfO layer 25b are provided between the ground wiring metal layer $V_{ss}$ and the TiN layer 6a and poly-Si layer 7a that function as a gate conductor layer of an SGT. With this structure, not only the same function as the function of the SGTs described with reference to FIGS. 3A to 3E is obtained, but also the occurrence of electrical short-circuit is prevented between the power supply wiring metal layer $V_{dd}$ and the TiN layer 6a and poly-Si layer 7a and between the ground wiring metal layer $V_{ss}$ and the TiN layer 6a and poly-Si layer 7a.

Fourth Embodiment

Figure 5A:
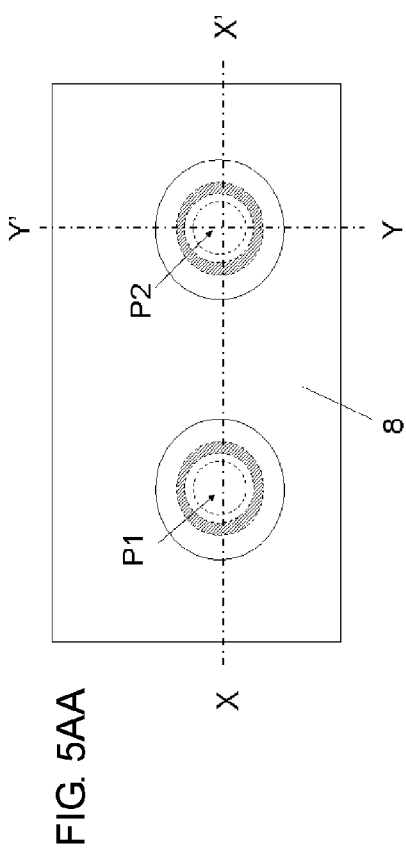
FIG. 5A(a) is a plan view and FIGS. 5A(b) and 5A(c) are cross-sectional views of a CMOS inverter circuit, the views illustrating a method for manufacturing a semiconductor device having SGTs according to a fourth embodiment.
Figure 5A:
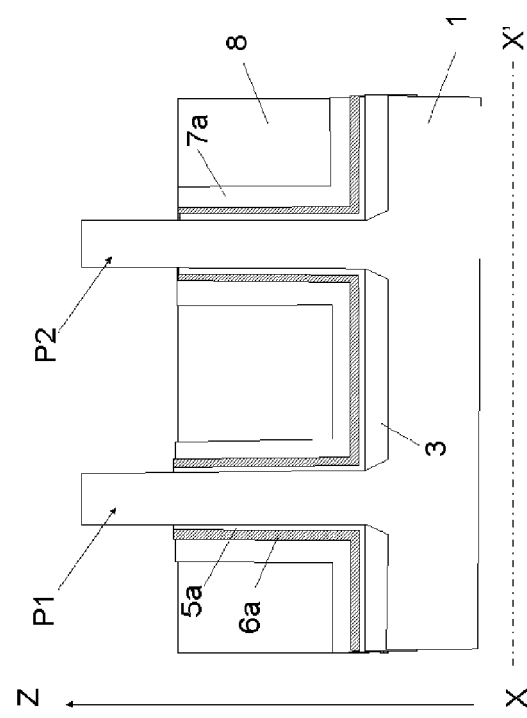
Figure 5A:
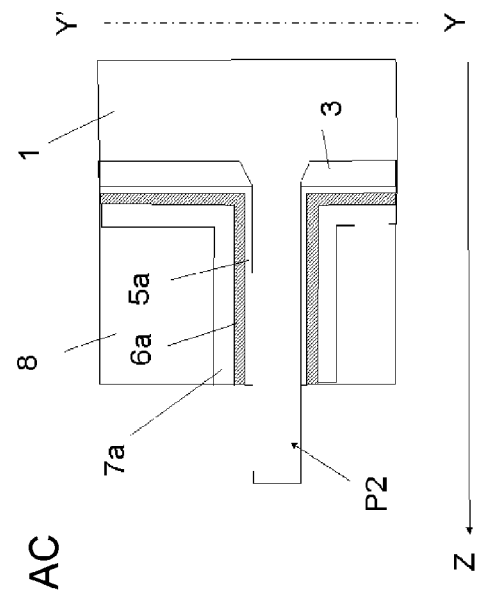
Figure 5B:
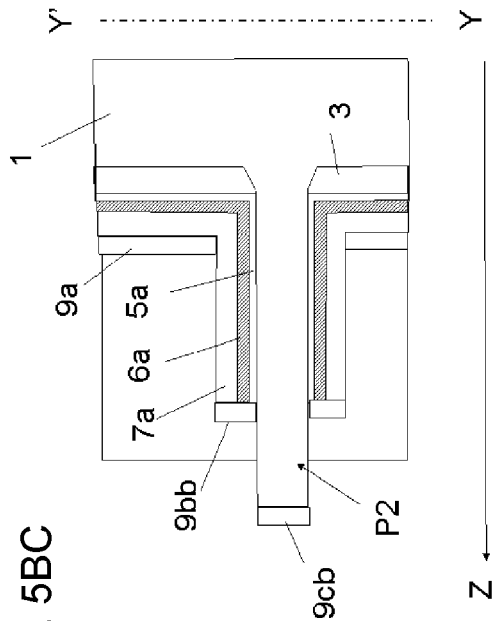
FIGS. 5B(a), 5B(b), and 5B(c) are a plan view and cross-sectional views of the CMOS inverter circuit, the views illustrating the method for manufacturing a semiconductor device having SGTs according to the fourth embodiment.
Figure 5B:
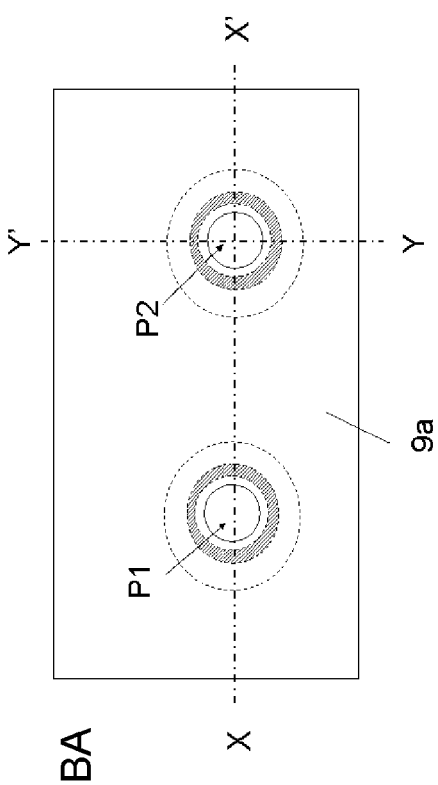
Figure 5B:
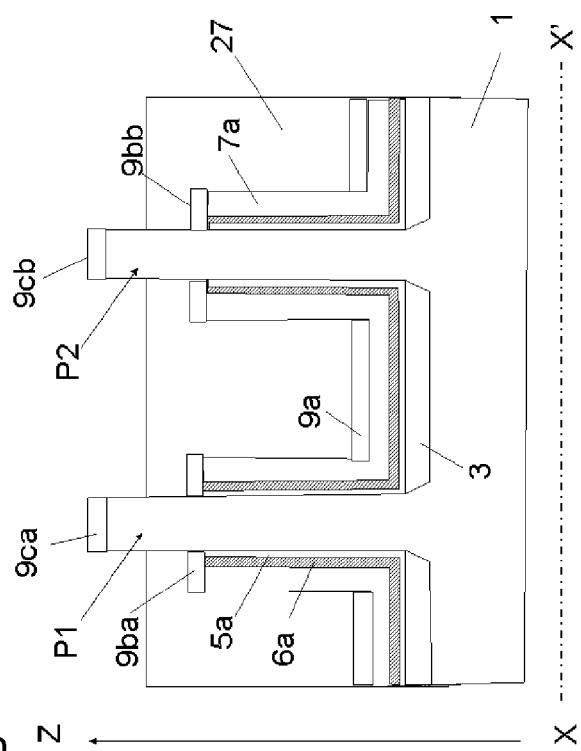

FIGS. 5A to 5C show a method for manufacturing a CMOS inverter circuit having SGTs according to a fourth embodiment of the present invention.

First, steps the same as the steps shown in FIGS. 1A to 1D of the first embodiment are performed. In FIG. 1D of the first embodiment, the $SiO_2$ layers 4a and 4b are respectively left on top portions of the Si pillars P1 and P2. In contrast, in the fourth embodiment, $SiO_2$ layers 4a and 4b are removed as shown in FIG. 5A. A resist layer is then removed.

Subsequently, the steps shown in FIGS. 1E and 1F of the first embodiment are performed. Subsequently, as shown in FIG. 5B, a resist is applied so as to cover the whole of an i-layer substrate 1 and Si pillars P1 and P2, and a surface layer portion of the resist is uniformly etched by an etch-back process. Thus, a resist layer 27 is formed so as to cover HfO layers 9ba and 9bb and expose HfO layers 9ca and 9cb provided on top portions of the Si pillars P1 and P2. Subsequently, the HfO layers 9ca and 9cb provided on the top portions of the Si pillars P1 and P2 are removed etching. The resist layer 27 is then removed.

Subsequently, the steps shown in FIG. 1G to 1O of the first embodiment are performed. Thus, a CMOS inverter circuit having SGTs is formed as shown in FIG. 5C.

In the fourth embodiment, as shown in FIG. 5C, the $SiO_2$ layers 4a and 4b and the HfO layers 9ca and 9cb on the top portions of the Si pillars P1 and P2 in FIG. 1O of the first embodiment are not formed. As shown in FIG. 5C, a Ni silicide layer 28a is formed on a side face and an upper surface of a $P^+$ region 13bb in the top portion of the Si pillar P1, and a Ni silicide layer 28b is formed on a side face and an upper surface of an $N^+$ region 12bb in the top portion of the Si pillar P2. With this structure, a CMOS inverter circuit in which the resistances of the $P^+$ region 13bb and the $N^+$ region 12bb that function as sources are lower than those of the first embodiment is formed. (In some circuits, an SGT circuit having a low drain resistance is obtained.) As a result, higher-speed driving of the circuit is realized.

Fifth Embodiment

Figures 6A, 6B, 6C:
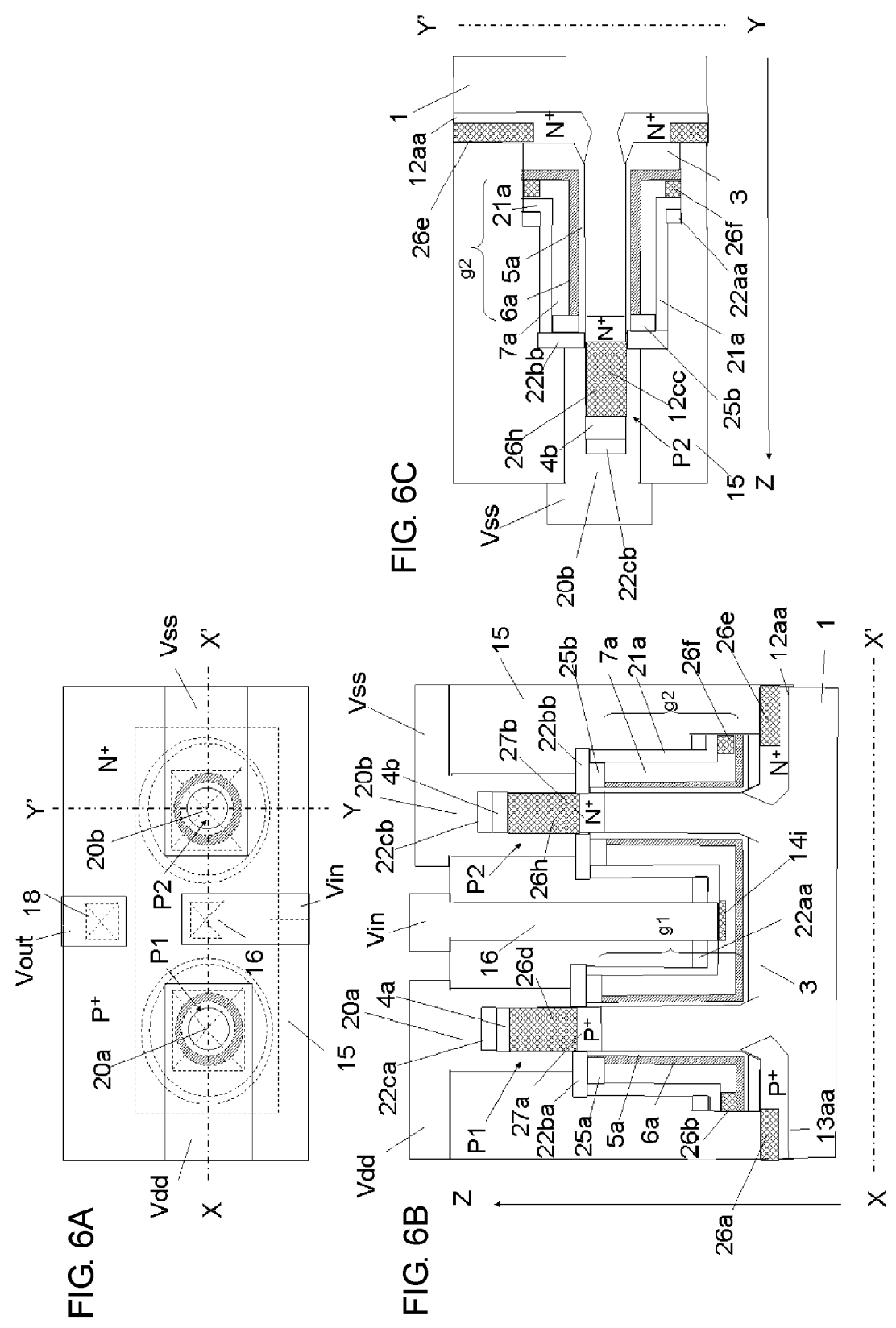

FIG. 6 shows a method for manufacturing a CMOS inverter circuit having SGTs according to a fifth embodiment of the present invention.

In the third embodiment, as shown in FIG. 4B, the Ni silicide layers 14d and 14h are respectively formed on outer peripheries of the $P^+$ region 13bb and the $N^+$ region 12bb in the top portions of the Si pillars P1 and P2 (the circuits of the first and second embodiments also have the same structure). In contrast, in the fifth embodiment, as shown in FIG. 6, Ni silicide layers 26d and 26h are respectively formed in all parts of Si pillars P1 and P2 that are in contact with contact holes 20a and 20b. In addition, a $P^+$ region 27a and an $N^+$ region 27b are formed so as to be in contact with the Ni silicide layers 26d and 26h, respectively. An impurity diffusion end of the $P^+$ region 27a is located near an upper end of a gate layer g1. An impurity diffusion end of the $N^+$ region 27b is located near an upper end of a gate layer g2. The Ni silicide layers 26d and 26h are formed by increasing the time of heat treatment performed after the formation of the Ni silicide layers 14a, 14b, 14d, 14e, 14f, and 14h shown in FIG. 1K. At the same time of the formation of the Ni silicide layers 26d and 26h, Ni silicide layers 26b, 26e, 26b, and 26f are formed in a $P^+$ region 13aa, an $N^+$ region 12aa, and side faces of lower portions of a poly-Si layer 7a so as to extend to deep positions. In addition, a Ni silicide layer 14i in a bottom portion of a contact hole 16 can also be formed so as to extend to a deeper position by performing the above heat treatment at the time of the formation of the Ni silicide layer 14i.

According to the fifth embodiment, the following (1) and (2) are obtained.

(1) The Ni silicide layers 26d and 26h having a low resistance are respectively formed in all parts of the Si pillars P1 and P2 that are in contact with the contact holes 20a and 20b. Accordingly, a CMOS inverter circuit having a low source resistance is formed (in some circuits, an SGT circuit having a low drain resistance is obtained) compared with the CMOS inverter circuits of the first to fourth embodiments, which include the Ni silicide layers 14d and 14h or 28a and 28b formed in surface layer portions of the Si pillars P1 and P2 that are in contact with the contact holes 20a and 20b.

(2) The Ni silicide layers 26d and 26h having a low resistance are respectively formed in all parts of the Si pillars P1 and P2 that are in contact with the contact holes 20a and 20b. Accordingly, a CMOS inverter circuit having a low source resistance is formed (in some circuits, an SGT circuit having a low drain resistance is obtained) without adding the steps of removing the $SiO_2$ layers 4a and 4b and the HfO layers 9ca and 9cb disposed on the top portions of the Si pillars P1 and P2 as in the fourth embodiment.

Sixth Embodiment

Figure 7A:
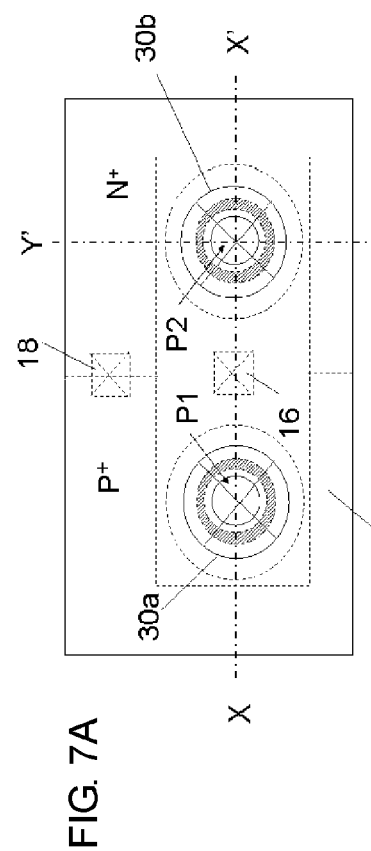
FIG. 7(a) is a plan view and FIGS. 7(b) and 7(c) are cross-sectional views of a CMOS inverter circuit, the views illustrating a method for manufacturing a semiconductor device having SGTs according to a sixth embodiment.
Figure 7B:
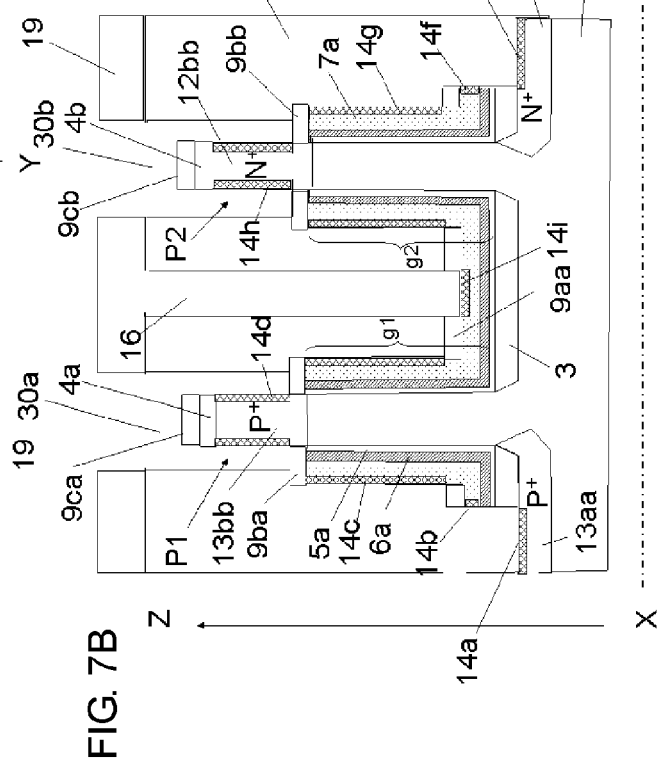
Figure 7C:
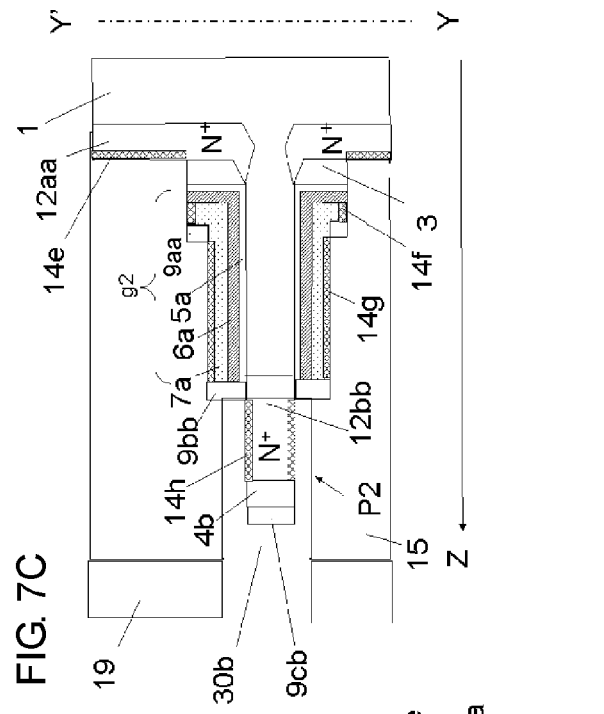
Figure 8:
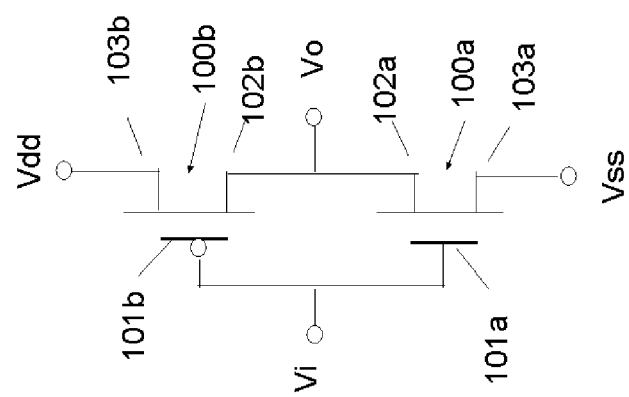
FIG. 8 is a CMOS inverter circuit diagram in the related art.
Figure 9:
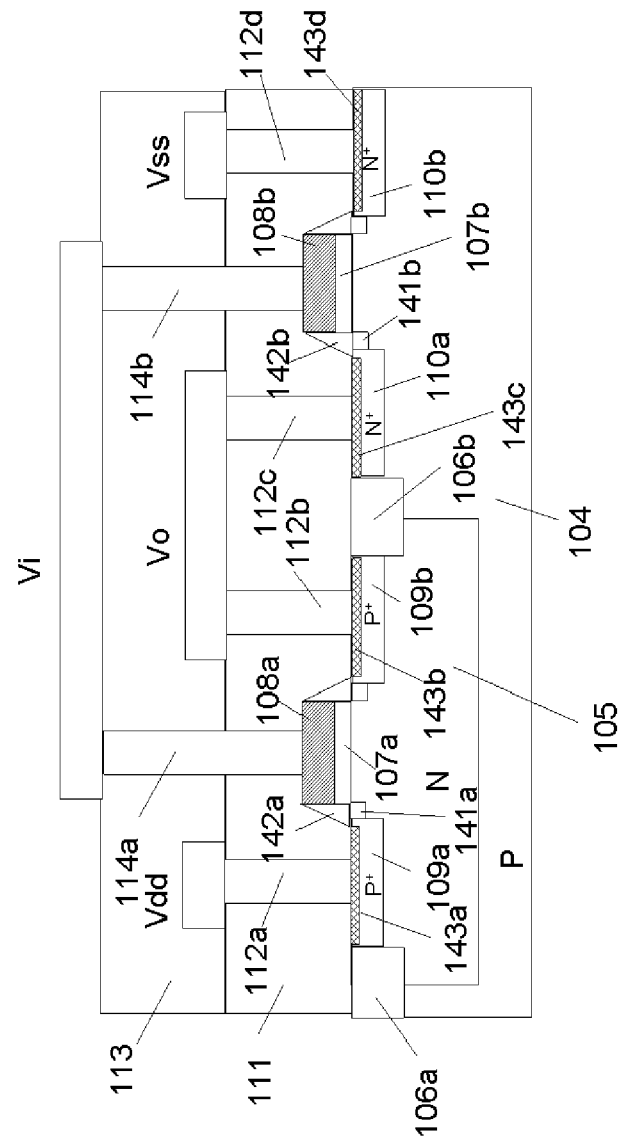
FIG. 9 is a cross-sectional view of a planar CMOS inverter circuit in the related art.
Figure 10:
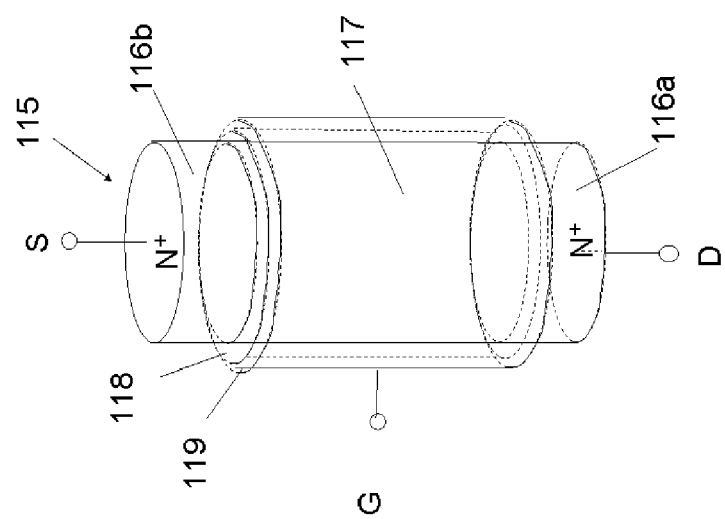
FIG. 10 is a structural schematic view of an SGT in the related art.
Figure 11:
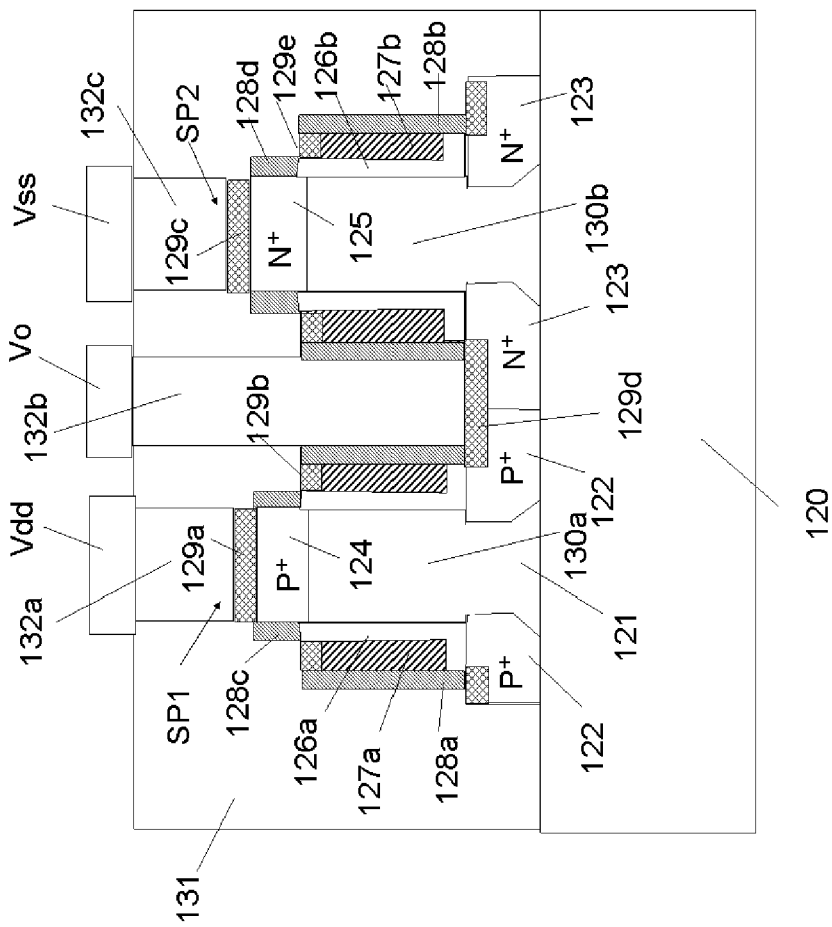
FIG. 11 is a cross-sectional view of a CMOS inverter circuit having SGTs in the related art.

FIG. 7 shows a method for manufacturing a CMOS inverter circuit having SGTs according to a sixth embodiment of the present invention.

As shown in FIG. 7, in a step corresponding to the step shown in FIG. 1N of the first embodiment, a resist layer 19 for forming contact holes 30a and 30b is formed by lithography so that outer peripheries of openings of the resist layer 19 viewed from above an upper surface of an i-layer substrate 1 each have a circular shape. The contact holes 30*a* and 30*b* are then formed on HfO layers 9*ba* and 9*bb*, respectively.

In FIG. 1N, the shape of openings of the resist layer 19 for forming the contact holes 20*a* and 20*b* is a rectangle. Accordingly, in order to reliably form the contact holes 20*a* and 20*b* having a rectangular cross section on the HfO layers 9*ba* and 9*bb* that are concentrically formed on the outer peripheries of the Si pillars P1 and P2, respectively, it is necessary to align a mask at four corners of each of the contact holes 20*a* and 20*b* with a high accuracy. In contrast, in the sixth embodiment, since the shape of openings of the resist layer 19 for forming the contact holes 30*a* and 30*b* is a circle, the mask alignment can be simplified and easily performed compared with the first embodiment.

In the above embodiments, Si pillars composed of silicon are used. However, the technical idea of the present invention can be applied to SGTs including semiconductor pillars composed of a material other than silicon.

In the above embodiments, the TiN layer 6*a* and the poly-Si layer 7*a* containing a donor or acceptor impurity are used as a gate conductor layer. These layers forming the gate conductor layer may be other metal layers. Alternatively, the gate conductor layer may have a multilayer structure including a TiN layer, a poly-Si layer, and a layer composed of another material.

In the above embodiments, the Ni silicide layers 14*a*, 14*b*, 14*c*, 14*d*, 14*e*, 14*f*, 14*g*, 14*h*, 14*i*, 26*b*, 26*b*, 26*d*, 26*e*, 26*f*, 26*h*, 28*a*, and 28*b* are used. Alternatively, these layers may be silicide layers of a metal other than Ni.

Silicide layers in top portions of the Si pillars P1 and P2 may be formed by covering the top portions with Ti, Ta, W, Ni, or the like after the formation of the contact holes 20*a* and 20*b* or 30*a* and 30*b*.

The N$^+$ regions 12*bb* and 27*b* and the P$^+$ regions 13*bb* and 27*a* in top portions of the Si pillars P1 and P2 may be formed by using, for example, a dope/epitaxy method, a molecular beam method, or an ALD method instead of an ion implantation method.

The N$^+$ regions 12*bb* and 27*b* and the P$^+$ regions 13*bb* and 27*a* in top portions of the Si pillars P1 and P2 may not be necessarily formed at the same time of the formation of the N$^+$ region 12*aa* and the P$^+$ region 13*aa* in the outer peripheries below the Si pillars P1 and P2.

In the above embodiments, a silicon-on-insulator (SOI) substrate in which an insulating substrate is provided on a bottom portion of the i-layer substrate 1 may be used instead of the i-layer substrate 1.

The sixth embodiment has been described in comparison with the first embodiment. However, also in the first to fifth embodiments, the effect of facilitating the formation of the contact holes 20*a* and 20*b* or 30*a* and 30*b* can be obtained as in the sixth embodiment.

In the above embodiments, HfO layers 5, 5*a*, 9, 9*a*, 9*ba*, 9*bb*, 9*ca*, 9*cb*, 9*aa*, 21, 21*a*, 22*aa*, 22*ba*, 22*bb*, 22*ca*, 22*cb*, 23*a*, 23*b*, 25*a*, and 25*b* are used as insulating layers. The material of the insulating layers is not limited to HfO, and other insulating materials may be used.

The HfO layers 23*a*, 23*b*, 9*ba*, and 9*bb* that are used as insulating layers in the third embodiment may be layers composed of an insulating material other than HfO and having an insulating property. For example, zirconium oxide (ZrO$_2$), cobalt titanium oxide (CoTiO$_3$), or the like may be used.

The HfO layers 5 and 5*a* are gate insulating layers, and thus HfO$_2$ is usually used. Other HfO layers 9, 9*a*, 9*ba*, 9*bb*, 9*ca*, 9*cb*, 9*aa*, 21, 21*a*, 22*aa*, 22*ba*, 22*bb*, 22*ca*, 22*cb*, and 23 may be layers composed of other materials as long as these layers function as insulating layers.

The fourth embodiment has been described on the basis of the first embodiment. However, the technical idea of the fourth embodiment can be applied to other embodiments.

In the third embodiment, as shown in FIG. 3A, the etching of the upper end portions 24*a* and 24*b* of the TiN layer 6*a* is performed after the formation of the HfO layer 5*a*, the TiN layer 6*a*, and the poly-Si layer 7*a* using the poly-Si layer 7*a* as an etching mask. However, the method is not limited thereto. The etching of the upper end portions 24*a* and 24*b* of the TiN layer 6*a* may be performed at the same time of the etching for forming the HfO layer 5*a*, the TiN layer 6*a*, and the poly-Si layer 7*a* using the resist layer 8 as an etching mask. This method can also be applied to the step shown in FIG. 4A.

In the embodiments of the present invention, a description has been made of cases where a single SGT is formed in each of the Si pillars P1 and P2. Also in a case where a plurality of SGTs are formed in a single semiconductor pillar (refer to Japanese Unexamined Patent Application Publication No. 2010-232631 and Hyoungiun Na and Tetsuo Endoh: "A New Compact SRAM cell by Vertical MOSFET for Low-power and Stable Operation", Memory Workshop, 201 3rd IEEE International Digest, pp. 1-4 (2011)), the present invention can be applied to the formation of a circuit including an SGT having a source or drain impurity region thereof in a top portion of a semiconductor pillar.

An SGT has a structure in which a gate insulating layer is formed on an outer periphery of a semiconductor pillar and a gate conductor layer is formed on an outer periphery of the gate insulating layer. A flash memory element including an electrically floating conductor layer provided between the gate conductor layer and the gate insulating layer is also an embodiment of an SGT. The technical idea of the present invention can be applied to such a flash memory element.

In the above embodiments, cases where only SGTs are formed in semiconductor pillars have been described. The technical idea of the present invention can also be applied to a method for manufacturing a semiconductor device including SGTs and other elements (for example, photodiodes and the like).

It is to be understood that various embodiments and modifications of the present invention can be made without departing from the broad spirit and the scope of the present invention. The embodiments described above are illustrative Examples of the present invention and do not limit the scope of the present invention. Any combination of the Examples and modifications can be made. Furthermore, even when part of the configuration of the above embodiments is removed as required, the embodiments are within the technical idea of the present invention.

The methods for manufacturing a semiconductor device having an SGT according to the present invention are useful for realizing a semiconductor device having an SGT and capable of being operated at a high speed.

The invention claimed is:

1. A semiconductor device having a surrounding gate transistor (SGT), the semiconductor device comprising:
    a semiconductor pillar formed on a substrate;
    a first impurity region formed in a lower part of the semiconductor pillar and containing a donor or acceptor impurity;
    a second impurity region formed in a top portion of the semiconductor pillar, the second impurity region being disposed above the first impurity region, containing a donor or acceptor impurity, and having the same conductivity type as the first impurity region;

a first insulating layer surrounding an outer periphery of the semiconductor pillar between the first impurity region and the second impurity region;

a first conductor layer surrounding an outer periphery of the first insulating layer;

an electrically conductive or nonconductive first material layer surrounding an outer periphery of the first conductor layer;

a second insulating layer which is disposed at a position higher than the first conductor layer and is in contact with an upper end surface of the first material layer;

a third insulating layer covering the substrate and the semiconductor pillar;

a contact hole formed in the third insulating layer, surrounding the top portion of the semiconductor pillar, and having a bottom portion that is in contact with a surface layer portion of the second insulating layer, in which an outer periphery of the bottom portion is located inside an outer periphery of the first material layer in plan view;

and a second conductor layer that is, in the contact hole, in contact with the surface layer portion of the second insulating layer and in contact with a side face of the top portion of the semiconductor pillar in which the second impurity region is formed, wherein an SGT is formed in which one of the first impurity region and the second impurity region functions as a source and the other functions as a drain, a part of the semiconductor pillar between the first impurity region and the second impurity region functions as a channel, the first insulating layer functions as a gate insulating layer, the first conductor layer functions as a gate conductor layer, and the second conductor layer is electrically connected to the second impurity region located in the top portion of the semiconductor pillar.

2. The semiconductor device having an SGT according to claim 1, further comprising an electrically conductive or nonconductive second material layer surrounding the outer periphery of the first conductor layer and disposed inside the first material layer, wherein the second insulating layer is formed at a position higher than the second material layer.

3. The semiconductor device having an SGT according to claim 1, further comprising a fifth insulating layer disposed between the first conductor layer and the second insulating layer.

4. The semiconductor device having an SGT according to claim 2, further comprising a sixth insulating layer disposed between the second material layer and the second insulating layer.

5. The semiconductor device having an SGT according to claim 1, wherein electrical connection between the second impurity region and the second conductor layer is established through an alloy layer that contains a semiconductor atom contained in the second impurity region and a metal atom and that is formed in the semiconductor pillar and connected to the contact hole, the second impurity region is in contact with the alloy layer, and a lower end of the second impurity region is located at a height of an upper end of the first conductor layer.

6. The semiconductor device having an SGT according to claim 5, wherein the alloy layer is formed in all parts of the top portion of the semiconductor pillar.

7. The semiconductor device having an SGT according to claim 1, wherein an outer periphery of the contact hole has a circular shape when viewed from above an upper surface of the substrate.

8. A method for manufacturing a semiconductor device having a surrounding gate transistor (SGT), the method comprising:

a semiconductor pillar forming step of forming a semiconductor pillar on a substrate;

a first impurity region forming step of forming a first impurity region in a lower part of the semiconductor pillar, the first impurity region containing a donor or acceptor impurity;

a second impurity region forming step of forming a second impurity region in a top portion of the semiconductor pillar, the second impurity region being disposed above the first impurity region, containing a donor or acceptor impurity, and having the same conductivity type as the first impurity region;

a first insulating layer forming step of forming a first insulating layer so as to surround an outer periphery of the semiconductor pillar between a region where the first impurity region is formed and a region where the second impurity region is formed;

a first material layer forming step of forming a first conductor layer so as to surround an outer periphery of the first insulating layer and forming an electrically conductive or nonconductive first material layer so as to surround an outer periphery of the first conductor layer;

a second insulating layer forming step of forming a second insulating layer so as to be disposed at a position higher than the first conductor layer and in contact with an upper end surface of the first material layer and so that an outer peripheral edge of the second insulating layer is substantially aligned with an outer peripheral edge of the first material layer;

a third insulating layer forming step of forming a third insulating layer so as to cover the substrate and the semiconductor pillar;

a contact hole forming step of forming a contact hole in the third insulating layer so as to surround the top portion of the semiconductor pillar and to have a bottom portion that is in contact with a surface layer portion of the second insulating layer and so that an outer periphery of the bottom portion is located inside an outer periphery of the first material layer in plan view; and a second conductor layer forming step of forming, in the contact hole, a second conductor layer so as to be in contact with the surface layer portion of the second insulating layer and to be in contact with a side face of the top portion of the semiconductor pillar in which the second impurity region is formed, wherein an SGT is formed in which one of the first impurity region and the second impurity region functions as a source and the other functions as a drain, a part of the semiconductor pillar between the first impurity region and the second impurity region functions as a channel, the first insulating layer functions as a gate insulating layer, the first conductor layer functions as a gate conductor layer, and the second conductor layer is electrically connected to the second impurity region located in the top portion of the semiconductor pillar.

9. The method for manufacturing a semiconductor device having an SGT according to claim 8, wherein, after the second insulating layer is formed, the second impurity region is formed in the top portion of the semiconductor pillar by using the second insulating layer as a mask.

10. The method for manufacturing a semiconductor device having an SGT according to claim 8, wherein the contact hole forming step is conducted in a plasma atmosphere which contains an etching ion and in which an etching rate of the third insulating layer is higher than an etching rate of the second insulating layer.

11. The method for manufacturing a semiconductor device having an SGT according to claim 8, further comprising:

a fourth insulating layer forming step of forming a fourth insulating layer so as to surround the outer periphery of the first conductor layer, wherein, in the second insulating layer forming step, the second insulating layer is formed so as to be disposed on the first conductor layer and in contact with an upper end surface of the fourth insulating layer.

12. The method for manufacturing a semiconductor device having an SGT according to claim 8, further comprising:

a fifth insulating layer forming step of forming a fifth insulating layer between the first conductor layer and the second insulating layer.

13. The method for manufacturing a semiconductor device having an SGT according to claim 12, wherein the fifth insulating layer forming step includes an etching stopper layer forming step of forming an etching stopper layer so as to surround the outer periphery of the first conductor layer, an etching step of removing an upper end portion of the first conductor layer by using the etching stopper layer as an etching mask, an insulating layer forming step of covering the whole of the substrate and the semiconductor pillar with an insulating layer, and a step of etching the insulating layer by isotropic plasma etching to form the fifth insulating layer on an upper end of the first conductor layer, and a thickness of the fifth insulating layer is larger than ½ of a thickness of the first conductor layer.

14. The method for manufacturing a semiconductor device having an SGT according to claim 8, further comprising:

a silicide layer forming step of forming a silicide layer in the semiconductor pillar so as to be connected to the contact hole, the silicide layer electrically connecting the second impurity region and the second conductor layer.

15. The method for manufacturing a semiconductor device having an SGT according to claim 14, wherein the silicide layer is formed in all parts of the top portion of the semiconductor pillar so as to be connected to the contact hole, and the second impurity region is formed so as to be in contact with the silicide layer and so that a lower end of the second impurity region is located at a height of an upper end of the first conductor layer.

16. The method for manufacturing a semiconductor device having an SGT according to claim 8, wherein the contact hole is formed so that an outer periphery of the contact hole has a circular shape when viewed from above an upper surface of the substrate.

\* \* \* \* \*